(12) United States Patent
Anagawa et al.

(10) Patent No.: US 12,228,621 B2
(45) Date of Patent: Feb. 18, 2025

(54) MAGNETIC SENSOR DEVICE

(71) Applicant: TDK CORPORATION, Tokyo (JP)

(72) Inventors: Kenkichi Anagawa, Tokyo (JP);
Shinichirou Mochizuki, Tokyo (JP);
Homare Tokida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 236 days.

(21) Appl. No.: 17/947,654

(22) Filed: Sep. 19, 2022

(65) Prior Publication Data

US 2023/0089798 A1 Mar. 23, 2023

Related U.S. Application Data

(60) Provisional application No. 63/246,441, filed on Sep. 21, 2021.

(51) Int. Cl.
*G01R 33/09* (2006.01)
*G01R 33/02* (2006.01)

(52) U.S. Cl.
CPC ......... *G01R 33/09* (2013.01); *G01R 33/0206* (2013.01); *G01R 33/093* (2013.01); *G01R 33/098* (2013.01)

(58) Field of Classification Search
CPC .. G01R 33/09; G01R 33/0206; G01R 33/093; G01R 33/098
See application file for complete search history.

(56) References Cited

U.S. PATENT DOCUMENTS

| | | | |
|---|---|---|---|
| 11,686,788 B2* | 6/2023 | Ota | G01R 33/0206 324/252 |
| 2007/0017290 A1* | 1/2007 | Shoji | G11B 19/04 73/514.39 |
| 2011/0031965 A1* | 2/2011 | Saruki | G01D 5/24476 324/207.25 |
| 2012/0038359 A1* | 2/2012 | Saruki | G01R 33/093 324/252 |
| 2015/0115938 A1* | 4/2015 | Kasajima | G01R 33/09 324/207.18 |
| 2016/0041238 A1* | 2/2016 | Bai | G01R 33/098 324/252 |
| 2016/0327617 A1 | 11/2016 | Deak et al. | |
| 2019/0195969 A1* | 6/2019 | Watanabe | H10N 50/10 |
| 2019/0285709 A1 | 9/2019 | Cai et al. | |
| 2019/0302198 A1* | 10/2019 | Masuda | G01R 33/0011 |
| 2019/0346514 A1 | 11/2019 | Deak | |
| 2020/0116801 A1* | 4/2020 | Watanabe | G01R 33/07 |
| 2020/0309867 A1 | 10/2020 | Belin | |
| 2020/0411401 A1* | 12/2020 | Ohmi | G01R 33/09 |

* cited by examiner

*Primary Examiner* — Paresh Patel
(74) *Attorney, Agent, or Firm* — Oliff PLC

(57) ABSTRACT

A magnetic sensor includes at least one sensor main body; a detection circuit provided on the at least one sensor main body, the detection circuit including a magnetic detection element; and a plurality of sensor terminals provided on the at least one sensor main body. The plurality of sensor terminals include a plurality of signal terminals and a plurality of power supply terminals. The plurality of signal terminals are all disposed on a side of one end of the at least one sensor main body. The plurality of power supply terminals include at least one first terminal disposed on the side of the one end of the at least one sensor main body, and a plurality of second terminals disposed on a side of another end of the at least one sensor main body.

8 Claims, 10 Drawing Sheets

MAGNETIC SENSOR DEVICE

CROSS REFERENCE TO RELATED APPLICATIONS

This application claims the benefit of U.S. Provisional Patent Application No. 63/246,441 filed on Sep. 21, 2021, the entire contents which are incorporated herein by their reference.

BACKGROUND

The technology relates to a magnetic sensor including magnetic detection elements, a signal processing circuit for a magnetic sensor, and a magnetic sensor device including a magnetic sensor and a signal processing circuit.

Magnetic sensor devices using magnetoresistive elements have been used for various applications in recent years. The magnetic sensor device includes a magnetic sensor and a signal processing circuit. The magnetic sensor is configured to detect a magnetic field as a detection target and generate at least one detection signal. The signal processing circuit is configured to perform predetermined signal processing on the at least one detection signal and generate a detection value having a correspondence with the magnetic field as the detection target.

U.S. Patent Application Publication No. 2020/0116801 A1 discloses a magnetic sensor device that includes a sensor chip including magnetic sensors and a circuit chip including a processor. In the magnetic sensor device, the sensor chip is mounted on a top surface of the circuit chip. Each of a top surface of the sensor chip and the top surface of the circuit chip is provided with a terminal group. The terminal group of the sensor chip is connected to the terminal group of the circuit chip by a plurality of bonding wires, for example.

The processor includes a signal processing circuit and a power supply circuit. In a typical processor, a signal processing circuit is configured as one independent block and a power supply circuit is configured as another independent block so that mutual interference between the signal processing circuit and the power supply circuit is suppressed.

The terminal group of the sensor chip includes a plurality of terminals for the magnetic sensors and a plurality of power supply terminals. In a case where the plurality of terminals for the magnetic sensors are collectively disposed and the plurality of power supply terminals are also collectively disposed in conformity with the processor, it has been necessary to increase the dimension of the sensor chip if the number of the plurality of terminals for the magnetic sensors and the number of the plurality of power supply terminals are not equal.

SUMMARY

A magnetic sensor according to one embodiment of the technology includes at least one sensor main body; a detection circuit provided on the at least one sensor main body, the detection circuit including a magnetic detection element; and a plurality of sensor terminals provided on the at least one sensor main body. The plurality of sensor terminals include a plurality of signal terminals and a plurality of power supply terminals. The plurality of signal terminals are all disposed on a side of one end of the at least one sensor main body. The plurality of power supply terminals include at least one first terminal disposed on the side of the one end of the at least one sensor main body, and a plurality of second terminals disposed on a side of another end of the at least one sensor main body.

In the magnetic sensor according to one embodiment of the technology, the plurality of power supply terminals include at least one first terminal and a plurality of second terminals disposed as described above. Thereby according to one embodiment of the technology, a magnetic sensor with a compact size can be implemented.

A signal processing circuit according to one embodiment of the technology is a signal processing circuit for a magnetic sensor. The signal processing circuit includes a circuit main body; a first block provided on the circuit main body, the first block being configured to process a detection signal of the magnetic sensor; a second block provided on the circuit main body, the second block being configured to supply power to the magnetic sensor; and a plurality of circuit terminals provided on the circuit main body. The plurality of circuit terminals include a plurality of signal terminals and a plurality of power supply terminals. The plurality of signal terminals are all disposed on a side of one end of the circuit main body. The plurality of power supply terminals include at least one first terminal disposed on the side of the one end of the circuit main body, and a plurality of second terminals disposed on a side of another end of the circuit main body.

In the signal processing circuit according to one embodiment of the technology, the plurality of power supply terminals include at least one first terminal and a plurality of second terminals disposed as described above. Thereby according to one embodiment of the technology, a magnetic sensor with a compact size can be used.

A magnetic sensor device according to one embodiment of the technology includes a magnetic sensor and a signal processing circuit for the magnetic sensor. The magnetic sensor includes at least one sensor main body, a detection circuit provided on the at least one sensor main body, the detection circuit including a magnetic detection element, and a plurality of sensor terminals provided on the at least one sensor main body. The plurality of sensor terminals include a plurality of first signal terminals and a plurality of first power supply terminals. The plurality of first signal terminals are all disposed on a side of one end of the at least one sensor main body. The plurality of first power supply terminals include at least one first terminal disposed on the side of the one end of the at least one sensor main body, and a plurality of second terminals disposed on a side of another end of the at least one sensor main body.

The signal processing circuit includes a circuit main body, a first block provided on the circuit main body, the first block being configured to process a detection signal of the magnetic sensor, a second block provided on the circuit main body, the second block being configured to supply power to the magnetic sensor, and a plurality of circuit terminals provided on the circuit main body. The plurality of circuit terminals include a plurality of second signal terminals respectively electrically connected to the plurality of first signal terminals, and a plurality of second power supply terminals respectively electrically connected to the plurality of first power supply terminals. The plurality of second signal terminals are all disposed on a side of one end of the circuit main body. The plurality of second power supply terminals include at least one third terminal disposed on the side of the one end of the circuit main body, and a plurality of fourth terminals disposed on a side of another end of the circuit main body.

In the magnetic sensor device according to one embodiment of the technology, the plurality of first power supply terminals include at least one first terminal and a plurality of second terminals disposed as described above, and the plurality of second power supply terminals include at least one third terminal and a plurality of fourth terminals disposed as described above. Thereby according to one embodiment of the technology, a magnetic sensor device including a magnetic sensor with a compact size can be implemented.

Other and further objects, features and advantages of the technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
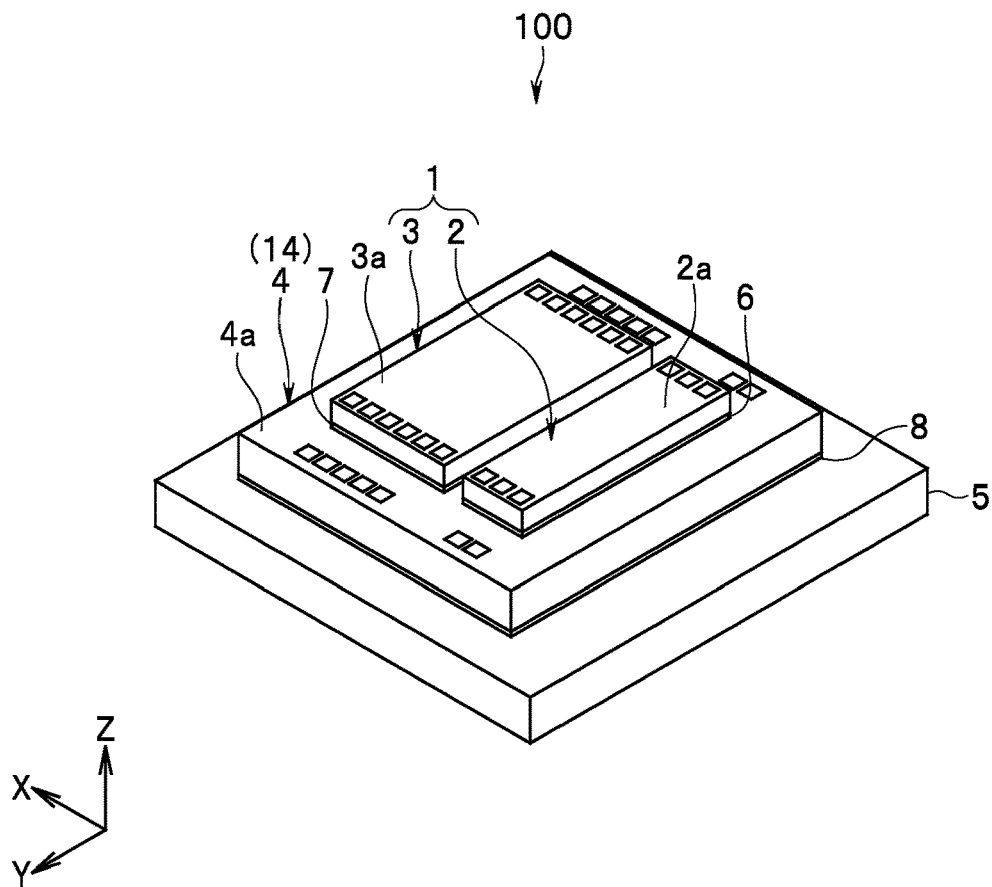
FIG. 1 is a perspective view showing a magnetic sensor device according to an example embodiment of the technology.

An object of the technology is to provide a magnetic sensor with a compact size, a signal processing circuit, and a magnetic sensor device.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

Figure 2:
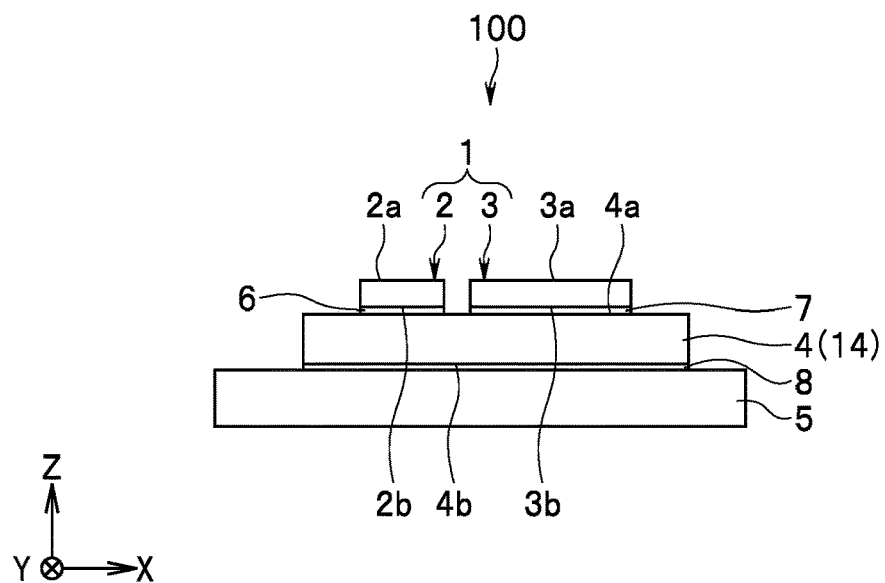
FIG. 2 is a side view showing the magnetic sensor device according to the example embodiment of the technology.
Figure 3:
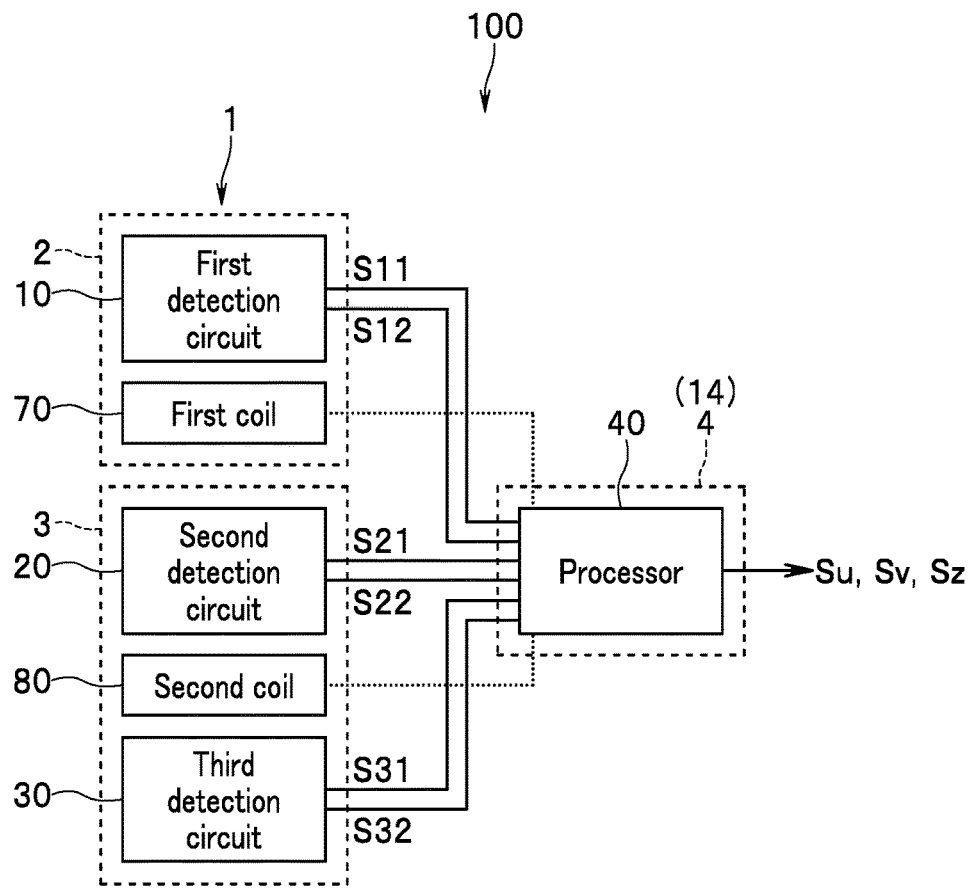
FIG. 3 is a functional block diagram showing a configuration of the magnetic sensor device according to the example embodiment of the technology.

First, a configuration of a magnetic sensor device including a magnetic sensor according to an example embodiment of the technology will be described with reference to FIGS. 1 to 3. FIG. 1 is a perspective view showing a magnetic sensor device 100. FIG. 2 is a side view showing the magnetic sensor device 100. FIG. 3 is a functional block diagram showing a configuration of the magnetic sensor device 100.

The magnetic sensor device 100 includes a magnetic sensor 1 according to the present example embodiment. The magnetic sensor 1 includes at least one sensor main body. The at least one sensor main body is in the form of a chip, for example. In particular, in the present example embodiment, the at least one sensor main body includes a first chip 2 and a second chip 3. The first chip 2 corresponds to a "first sensor main body" of the technology. The second chip 3 corresponds to a "second sensor main body" of the technology. Components of the first chip 2 are also components of the first sensor main body. Components of the second chip 3 are also components of the second sensor main body.

The magnetic sensor device 100 further includes a signal processing circuit 14 for the magnetic sensor 1. The signal processing circuit 14 includes a circuit main body 4. The circuit main body 4 is used as a support for supporting the first and second chips 2 and 3. The first chip 2, the second chip 3, and the circuit main body 4 each have a rectangular solid shape. The circuit main body 4 has a reference plane 4a that is a top surface, a bottom surface located opposite to the reference plane 4a, and four side surfaces connecting the reference plane 4a and the bottom surface 4b.

Now, a description will be given of a reference coordinate system in the present example embodiment with reference to FIGS. 1 and 2. The reference coordinate system is an orthogonal coordinate system that is set with reference to the magnetic sensor device 100 and defined by three axes. An X direction, a Y direction, and a Z direction are defined in the reference coordinate system. The X, Y, and Z directions are orthogonal to each other. In particular, in the present example embodiment, a direction that is perpendicular to the reference plane 4a of the circuit main body 4 and directed from the bottom surface 4b of the circuit main body 4 to the reference plane 4a is referred to as the Z direction. The opposite directions to the X, Y, and Z directions will be expressed as −X, −Y, and −Z directions, respectively. The three axes defining the reference coordinate system are an axis parallel to the X direction, an axis parallel to the Y direction, and an axis parallel to the Z direction.

Hereinafter, the term "above" refers to positions located forward of a reference position in the Z direction, and "below" refers to positions opposite from the "above" positions with respect to the reference position. For each component of the magnetic sensor device 100, the term "top surface" refers to a surface of the component located at the end thereof in the Z direction, and "bottom surface" refers to a surface of the component located at the end thereof in the −Z direction. The expression "when seen in the Z direction" means that the intended object is seen from a position at a distance in the Z direction.

The first chip 2 has a top surface 2a and a bottom surface 2b that are located opposite to each other, and four side surfaces connecting the top surface 2a and the bottom surface 2b. The second chip 3 has a top surface 3a and a bottom surface 3b that are located opposite to each other, and four side surfaces connecting the top surface 3a and the bottom surface 3b.

The first chip 2 is mounted on the reference plane 4a in a posture such that the bottom surface 2b of the first chip 2 faces the reference plane 4a of the circuit main body 4. The second chip 3 is mounted on the reference plane 4a in a posture such that the bottom surface 3b of the second chip 3 faces the reference plane 4a of the circuit main body 4. The first chip 2 and the second chip 3 are bonded to the circuit main body 4 with, for example, adhesives 6 and 7, respectively.

The magnetic sensor 1 includes a first detection circuit 10, a second detection circuit 20, and a third detection circuit 30. The first detection circuit 10 is provided on the first chip 2. The second detection circuit 20 and the third detection circuit 30 are provided on the second chip 3.

The first to third detection circuits 10, 20, and 30 each include a plurality of magnetic detection elements, and are configured to detect a target magnetic field and generate at least one detection signal. In particular, in the example embodiment, the plurality of magnetic detection elements are a plurality of magnetoresistive elements. The magnetoresistive elements will hereinafter be referred to as MR elements.

The signal processing circuit 14 includes a processor 40 provided in the circuit main body 4. The processor 40 is a main part of the signal processing circuit 14. The processor 40 is configured to generate a first detection value, a second detection value, and a third detection value by processing the plurality of detection signals generated by the first to third detection circuits 10, 20, and 30. The first, second, and third detection values have a correspondence with components of the magnetic field in three respective different directions at a predetermined reference position. In particular, in the present example embodiment, the foregoing three different directions are two directions parallel to an XY plane and a direction parallel to the Z direction. For example, the processor 40 is constructed of an application-specific integrated circuit (ASIC).

The first to third detection circuits 10, 20, and 30 and the processor 40 are connected via a plurality of bonding wires. The connection between the first to third detection circuits 10, 20, and 30 and the processor 40 will be described in detail later.

The magnetic sensor device 100 may be mounted on a printed board 5, for example. In such a case, the magnetic sensor device 100 is mounted on a top surface of the printed board 5 in such a posture that the bottom surface 4b of the circuit main body 4 faces the top surface of the printed board 5. The circuit main body 4 is bonded to the printed board 5 with, for example, an adhesive 8. The magnetic sensor device 100 mounted on the printed board 5 is sealed with a not-shown molded resin.

Figure 4:
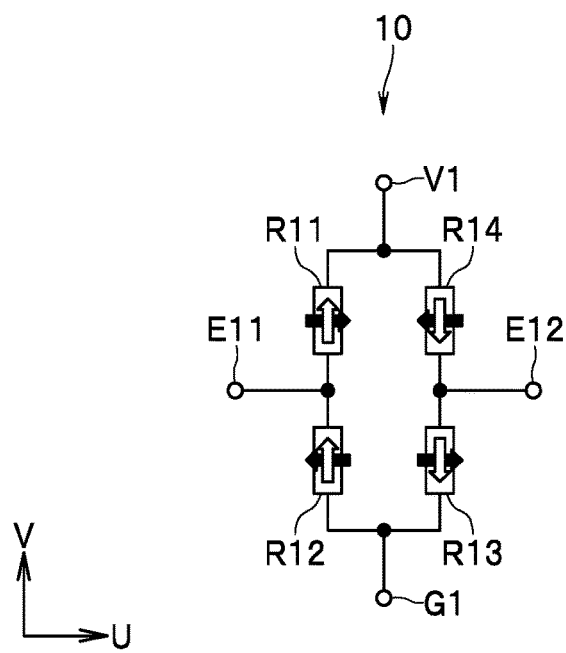
FIG. 4 is a circuit diagram showing a circuit configuration of a first detection circuit of the example embodiment of the technology.
Figure 5:
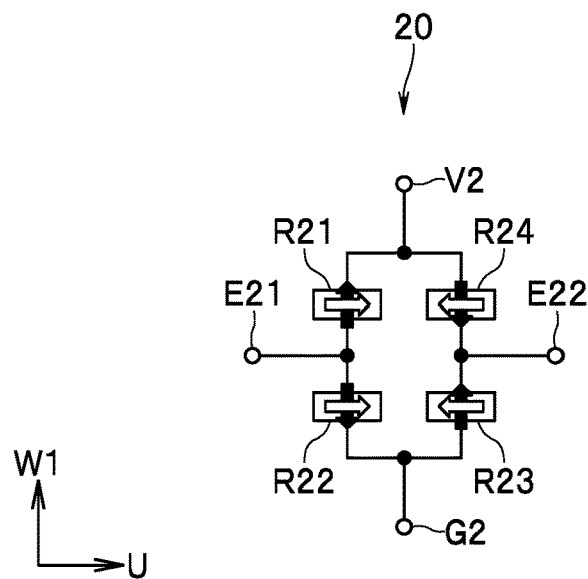
FIG. 5 is a circuit diagram showing a circuit configuration of a second detection circuit of the example embodiment of the technology.
Figure 6:
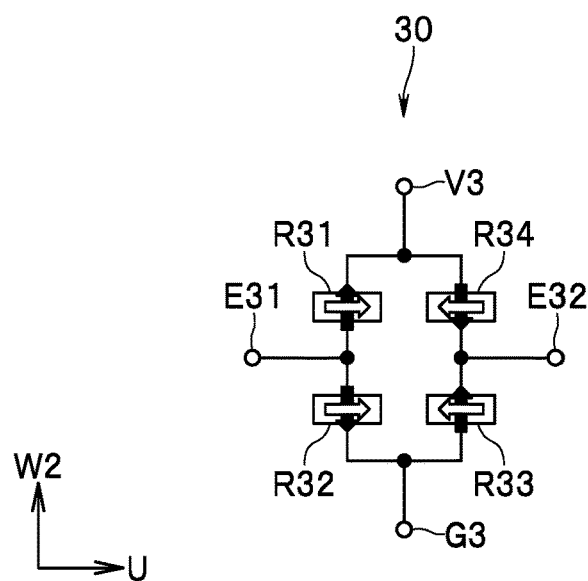
FIG. 6 is a circuit diagram showing a circuit configuration of a third detection circuit of the example embodiment of the technology.
Figure 7:
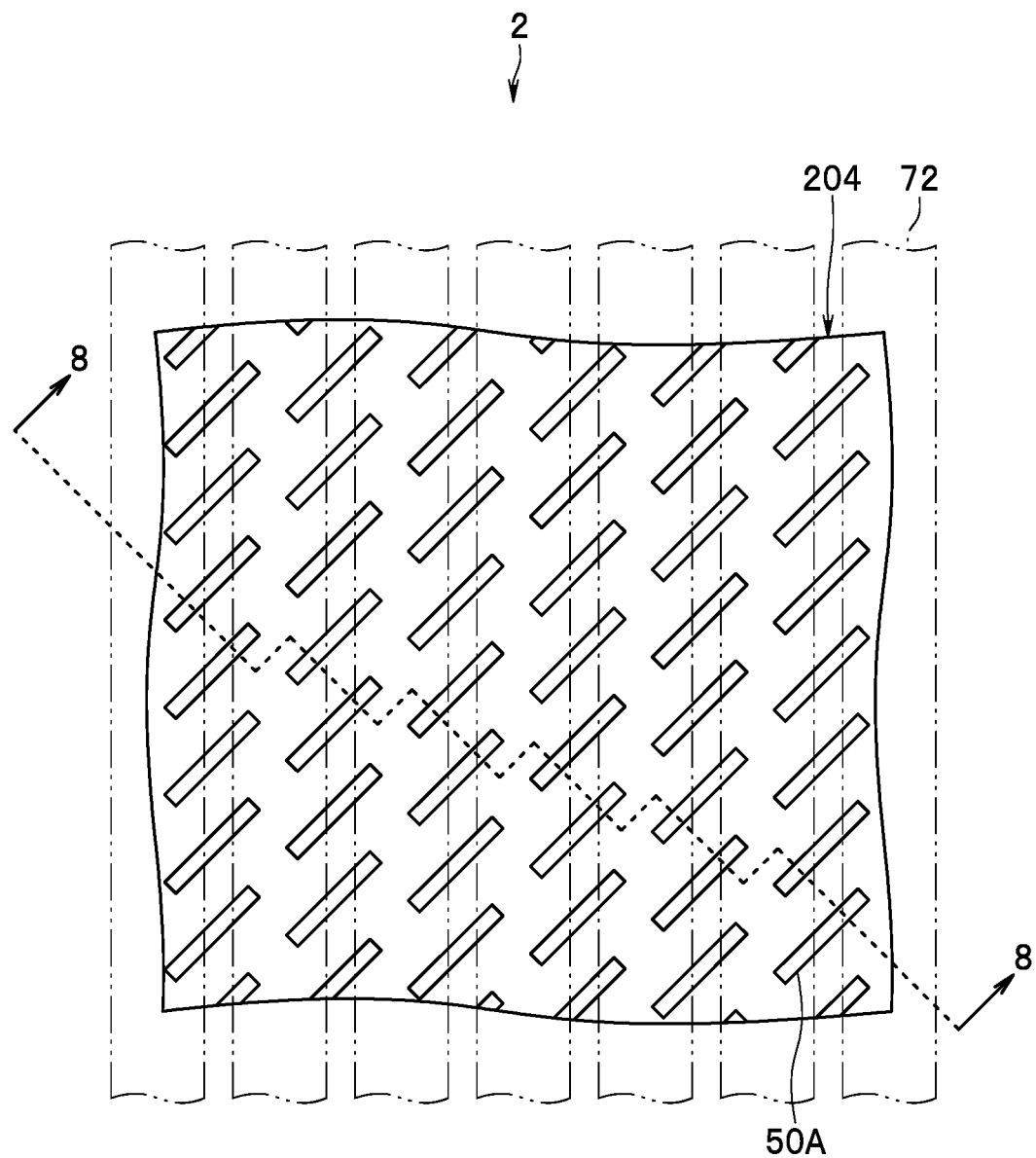
FIG. 7 is a plan view showing a part of a first chip of the example embodiment of the technology.
Figure 7:
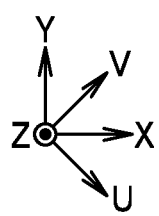
Figure 8:
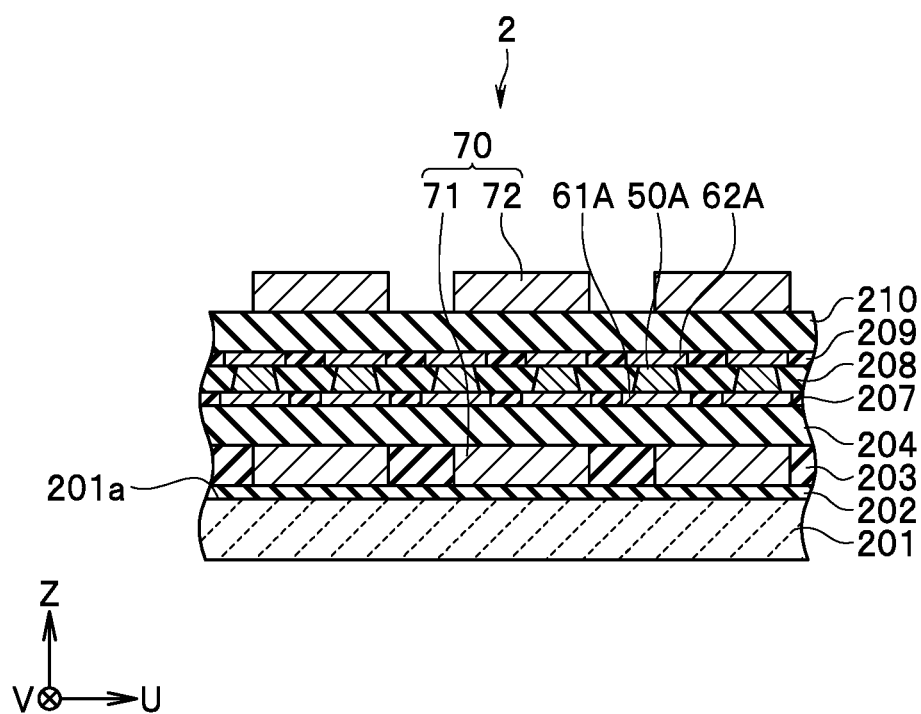
FIG. 8 is a sectional view showing a part of the first chip of the example embodiment of the technology.
Figure 9:
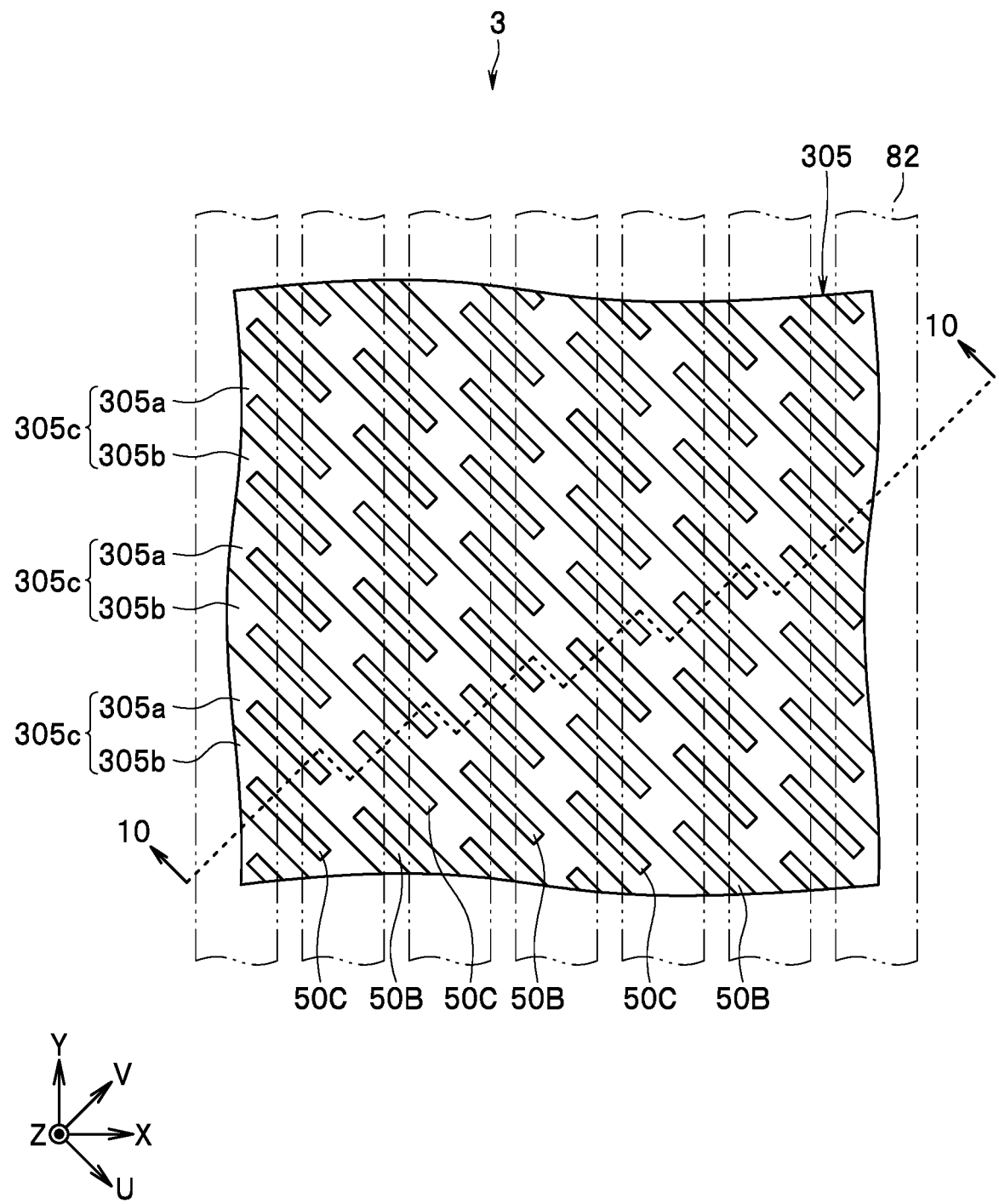
FIG. 9 is a plan view showing a part of a second chip of the example embodiment of the technology.
Figure 10:
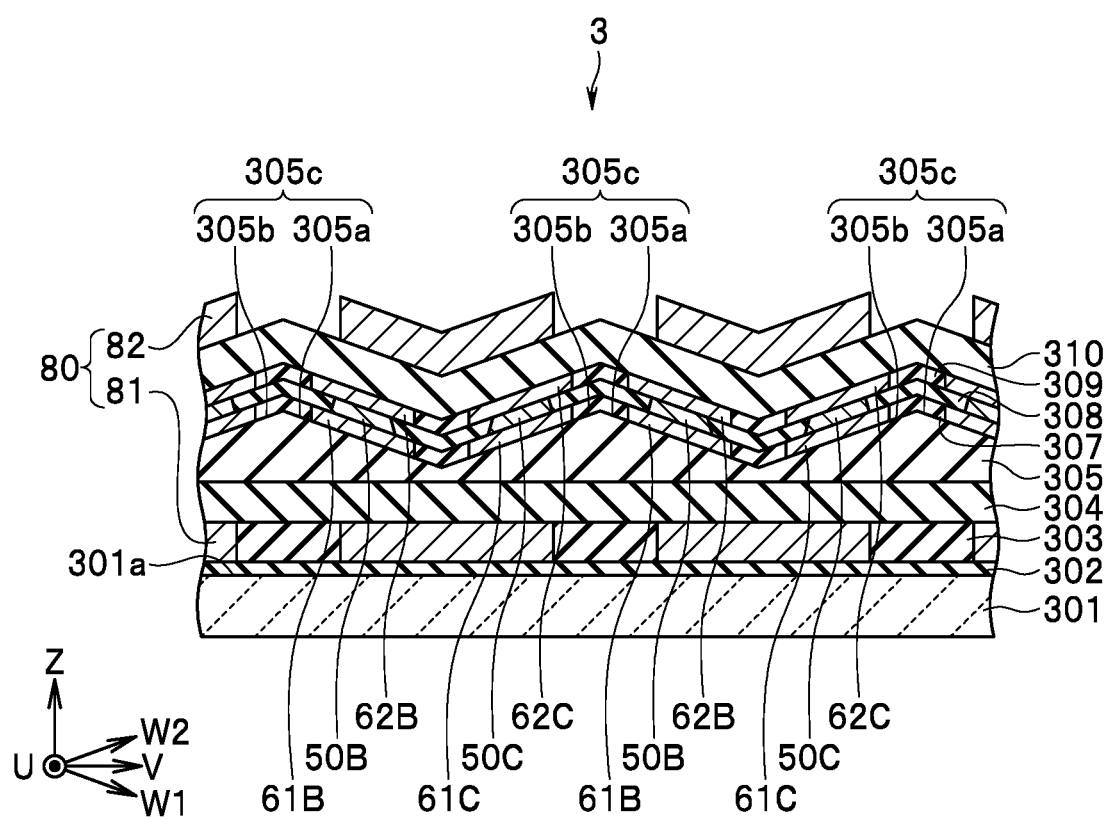
FIG. 10 is a sectional view showing a part of the second chip of the example embodiment of the technology.

Next, the first to third detection circuits 10, 20, and 30 will be described with reference to FIGS. 3 to 10. FIG. 4 is a circuit diagram showing a circuit configuration of the first detection circuit 10. FIG. 5 is a circuit diagram showing a circuit configuration of the second detection circuit 20. FIG. 6 is a circuit diagram showing a circuit configuration of the third detection circuit 30. FIG. 7 is a plan view showing a part of the first chip 2. FIG. 8 is a sectional view showing a part of the first chip 2. FIG. 9 is a plan view showing a part of the second chip 3. FIG. 10 is a sectional view showing a part of the second chip 3.

Here, as shown in FIGS. 7 and 9, a U direction and a V direction are defined as follows. The U direction is a direction rotated from the X direction to the −Y direction. The V direction is a direction rotated from the Y direction to the X direction. More specifically, in the present example embodiment, the U direction is set to a direction rotated from the X direction to the −Y direction by α, and the V direction is set to a direction rotated from the Y direction to the X direction by α. Note that α is an angle greater than 0° and smaller than 90°. In one example, α is 45°. A −U direction refers to a direction opposite to the U direction, and a −V direction refers to a direction opposite to the V direction.

As shown in FIG. 10, a W1 direction and a W2 direction are defined as follows. The W1 direction is a direction rotated from the V direction to the −Z direction. The W2 direction is a direction rotated from the V direction to the Z direction. More specifically, in the present example embodiment, the W1 direction is set to a direction rotated from the V direction to the −Z direction by β, and the W2 direction is set to a direction rotated from the V direction to the Z direction by β. Note that β is an angle greater than 0° and smaller than 90°. A −W1 direction refers to a direction opposite to the W1 direction, and a −W2 direction refers to a direction opposite to the W2 direction. The W1 direction and W2 direction both are orthogonal to the U direction.

The first detection circuit 10 is configured to detect a component of the target magnetic field in a direction parallel to the U direction and generate at least one first detection signal which has a correspondence with the component. The second detection circuit 20 is configured to detect a component of the target magnetic field in a direction parallel to the W1 direction and generate at least one second detection signal which has a correspondence with the component. The third detection circuit 30 is configured to detect a component of the target magnetic field in a direction parallel to the W2 direction and generate at least one third detection signal which has a correspondence with the component.

As shown in FIG. 4, the first detection circuit 10 includes a power supply port V1, a ground port G1, signal output ports E11 and E12, a first resistor section R11, a second resistor section R12, a third resistor section R13, and a fourth resistor section R14. The plurality of MR elements of the first detection circuit 10 constitute the first to fourth resistor sections R11, R12, R13, and R14.

The first resistor section R11 is provided between the power supply port V1 and the signal output port E11. The second resistor section R12 is provided between the signal output port E11 and the ground port G1. The third resistor section R13 is provided between the signal output port E12 and the ground port G1. The fourth resistor section R14 is provided between the power supply port V1 and the signal output port E12.

As shown in FIG. 5, the second detection circuit 20 includes a power supply port V2, a ground port G2, signal output ports E21 and E22, a first resistor section R21, a second resistor section R22, a third resistor section R23, and a fourth resistor section R24. The plurality of MR elements of the second detection circuit 20 constitute the first to fourth resistor sections R21, R22, R23, and R24.

The first resistor section R21 is provided between the power supply port V2 and the signal output port E21. The second resistor section R22 is provided between the signal output port E21 and the ground port G2. The third resistor section R23 is provided between the signal output port E22 and the ground port G2. The fourth resistor section R24 is provided between the power supply port V2 and the signal output port E22.

As shown in FIG. 6, the third detection circuit 30 includes a power supply port V3, a ground port G3, signal output ports E31 and E32, a first resistor section R31, a second resistor section R32, a third resistor section R33, and a fourth resistor section R34. The plurality of MR elements of the third detection circuit 30 constitute the first to fourth resistor sections R31, R32, R33, and R34.

The first resistor section R31 is provided between the power supply port V3 and the signal output port E31. The second resistor section R32 is provided between the signal output port E31 and the ground port G3. The third resistor section R33 is provided between the signal output port E32 and the ground port G3. The fourth resistor section R34 is provided between the power supply port V3 and the signal output port E32.

A voltage or current of predetermined magnitude is applied to each of the power supply ports V1 to V3. Each of the ground ports G1 to G3 is connected to the ground.

The plurality of MR elements of the first detection circuit 10 will hereinafter be referred to as a plurality of first MR elements 50A. The plurality of MR elements of the second detection circuit 20 will be referred to as a plurality of second MR elements 50B. The plurality of MR elements of the third detection circuit 30 will be referred to as a plurality of third MR elements 50C. Since the first to third detection circuits 10, 20, and 30 are components of the magnetic sensor 1, it can be said that the magnetic sensor 1 includes the plurality of first MR elements 50A, the plurality of second MR elements 50B, and the plurality of third MR elements 50C. Any given MR element will be denoted by the reference numeral 50.

Figure 11:
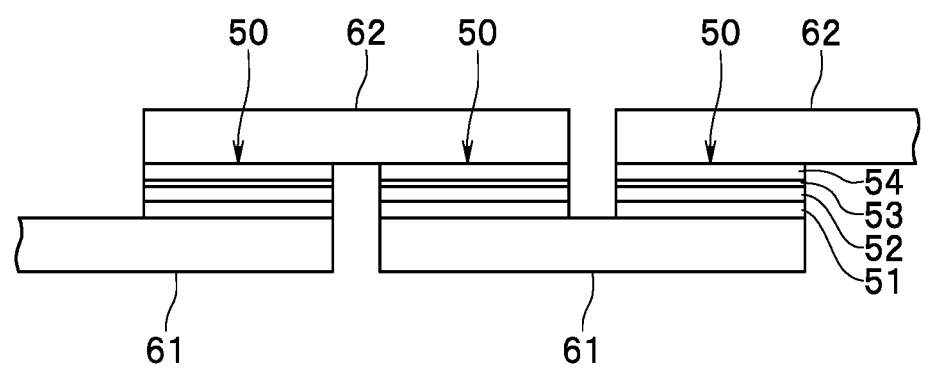
FIG. 11 is a side view showing a magnetoresistive element of the example embodiment of the technology.

FIG. 11 is a side view showing the MR elements 50. Each MR element 50 may be a spin-valve MR element or an anisotropic magnetoresistive (AMR) element. In particular, in the present example embodiment, each MR element 50 is a spin-valve MR element. The MR element 50 includes a magnetization pinned layer 52 having a magnetization whose direction is fixed, a free layer 54 having a magnetization whose direction is variable depending on the direction of a target magnetic field, and a gap layer 53 located between the magnetization pinned layer 52 and the free layer 54. The MR element 50 may be a tunneling magnetoresistive (TMR) element or a giant magnetoresistive (GMR) element. In the TMR element, the gap layer 53 is a tunnel barrier layer. In the GMR element, the gap layer 53 is a nonmagnetic conductive layer. The resistance of the MR element 50 changes with the angle that the magnetization direction of the free layer 54 forms with respect to the magnetization direction of the magnetization pinned layer 52. The resistance of the MR element 50 is at its minimum value when the foregoing angle is 0°, and at its maximum value when the foregoing angle is 180°. In each MR element 50, the free layer 54 has a shape anisotropy that sets the direction of the magnetization easy axis to be orthogonal to the magnetization direction of the magnetization pinned layer 52. As a method for setting the magnetization easy axis in a predetermined direction in the free layer 54, a magnet configured to apply a bias magnetic field to the free layer 54 can be used.

The MR element 50 further includes an antiferromagnetic layer 51. The antiferromagnetic layer 51, the magnetization pinned layer 52, the gap layer 53, and the free layer 54 are stacked in this order. The antiferromagnetic layer 51 is formed of an antiferromagnetic material, and is in exchange coupling with the magnetization pinned layer 52 to thereby pin the magnetization direction of the magnetization pinned layer 52. The magnetization pinned layer 52 may be a so-called self-pinned layer (Synthetic Ferri Pinned layer, SFP layer). The self-pinned layer has a stacked ferri structure in which a ferromagnetic layer, a nonmagnetic intermediate layer, and a ferromagnetic layer are stacked, and the two ferromagnetic layers are antiferromagnetically coupled. In a case where the magnetization pinned layer 52 is the self-pinned layer, the antiferromagnetic layer 51 may be omitted.

It should be appreciated that the layers 51 to 54 of each MR element 50 may be stacked in the reverse order to that shown in FIG. 11.

In FIGS. 4 to 6, solid arrows represent the magnetization directions of the magnetization pinned layers 52 of the MR elements 50. Hollow arrows represent the magnetization directions of the free layers 54 of the MR elements 50 in a case where no target magnetic field is applied to the MR elements 50.

In the example shown in FIG. 4, the magnetization directions of the magnetization pinned layers 52 in each of the first and third resistor sections R11 and R13 are the U direction. The magnetization directions of the magnetization pinned layers 52 in each of the second and fourth resistor sections R12 and R14 are the −U direction. The free layer 54 in each of the plurality of first MR elements 50A has a shape anisotropy that sets the direction of the magnetization easy axis to a direction parallel to the V direction. The magnetization directions of the free layers 54 in each of the first and second resistor sections R11 and R12 in a case where no target magnetic field is applied to the first MR elements 50A are the V direction. The magnetization directions of the free layers 54 in each of the third and fourth resistor sections R13 and R14 in the foregoing case are the −V direction.

In the example shown in FIG. 5, the magnetization directions of the magnetization pinned layers 52 in each of the first and third resistor sections R21 and R23 are the W1 direction. The magnetization directions of the magnetization pinned layers 52 in each of the second and fourth resistor sections R22 and R24 are the −W1 direction. The free layer 54 in each of the plurality of second MR elements 50B has a shape anisotropy that sets the direction of the magnetization easy axis to a direction parallel to the U direction. The magnetization directions of the free layers 54 in each of the first and second resistor sections R21 and R22 in a case where no target magnetic field is applied to the second MR elements 50B are the U direction. The magnetization directions of the free layers 54 in each of the third and fourth resistor sections R23 and R24 in the foregoing case are the −U direction.

In the example shown in FIG. 6, the magnetization directions of the magnetization pinned layers 52 in each of the first and third resistor sections R31 and R33 are the W2 direction. The magnetization directions of the magnetization pinned layers 52 in each of the second and fourth resistor sections R32 and R34 are the −W2 direction. The free layer 54 in each of the plurality of third MR elements 50C has a shape anisotropy that sets the direction of the magnetization easy axis to a direction parallel to the U direction. The magnetization directions of the free layers 54 in each of the first and second resistor sections R31 and R32 in a case where no target magnetic field is applied to the third MR elements 50C are the U direction. The magnetization directions of the free layers 54 in each of the third and fourth resistor sections R33 and R34 in the foregoing case are the −U direction.

The magnetic sensor 1 includes a magnetic field generator configured to apply a magnetic field in a predetermined direction to the free layer 54 of each of the plurality of first MR elements 50A, the plurality of second MR elements 50B, and the plurality of third MR elements 50C. In the example embodiment, the magnetic field generator includes a first coil 70 that applies a magnetic field in the predetermined direction to the free layer 54 in each of the first MR elements 50A, and a second coil 80 that applies a magnetic field in the predetermined direction to the free layer 54 in each of the plurality of second MR elements 50B and the plurality of third MR elements 50C. The first chip 2 includes the first coil 70. The second chip 3 includes the second coil 80.

In view of the manufacturing precision and the like of the MR elements 50, the magnetization directions of the magnetization pinned layers 52 and the directions of the magnetization easy axes of the free layers 54 may be slightly different from the foregoing directions. The magnetization pinned layers 52 may be magnetized to include magnetization components having the foregoing directions as their main components. In such a case, the magnetization directions of the magnetization pinned layers 52 are the same or substantially the same as the foregoing directions.

A specific structure of the first and second chips 2 and 3 will be described in detail below. First, a structure of the first chip 2 will be described with reference to FIGS. 7 and 8. FIG. 8 shows a part of a cross section at the position indicated by the line 8-8 in FIG. 7.

The first chip 2 includes a substrate 201 having a top surface 201a, insulating layers 202, 203, 204, 207, 208, 209, and 210, a plurality of lower electrodes 61A, a plurality of upper electrodes 62A, a plurality of lower coil elements 71, and a plurality of upper coil elements 72. The top surface 201a of the substrate 201 is parallel to the XY plane. The Z direction is also a direction perpendicular to the top surface 201a of the substrate 201. The coil elements are a part of the coil winding.

The insulating layer 202 is disposed on the substrate 201. The plurality of lower coil elements 71 are disposed on the insulating layer 202. The insulating layer 203 is disposed around the plurality of lower coil elements 71 on the insulating layer 202. The insulating layer 204 is disposed on the plurality of lower coil elements 71 and the insulating layer 203.

The plurality of lower electrodes 61A are disposed on the insulating layer 204. The insulating layer 207 is disposed around the plurality of lower electrodes 61A on the insulating layer 204. The plurality of first MR elements 50A are disposed on the plurality of lower electrodes 61A. The insulating layer 208 is disposed around the plurality of first MR elements 50A on the plurality of lower electrodes 61A and the insulating layer 207. The plurality of upper electrodes 62A are disposed on the plurality of first MR elements 50A and the insulating layer 208. The insulating layer 209 is disposed around the plurality of upper electrodes 62A on the insulating layer 208.

The insulating layer 210 is disposed on the plurality of upper electrodes 62A and the insulating layer 209. The plurality of upper coil elements 72 are disposed on the insulating layer 210. The first chip 2 may further include a not-shown insulating layer that covers the plurality of upper coil elements 72 and the insulating layer 210. FIG. 7 shows the insulating layer 204, the plurality of first MR elements 50A, and the plurality of upper coil elements 72 among the components of the first chip 2.

The top surface 201a of the substrate 201 is parallel to the XY plane. The top surface of each of the plurality of lower electrodes 61A is also parallel to the XY plane. The reference plane 4a is parallel to the XY plane. Thus, in the foregoing state, it can be said that the plurality of first MR elements 50A are disposed on a plane parallel to the reference plane 4a.

As shown in FIG. 7, the plurality of first MR elements 50A are disposed so that two or more MR elements 50A are arranged both in the U direction and in the V direction. The plurality of first MR elements 50A are connected in series by the plurality of lower electrodes 61A and the plurality of upper electrodes 62A.

A method for connecting the plurality of first MR elements 50A will now be described in detail with reference to FIG. 11. In FIG. 11, the reference numerals 61 denote lower electrodes corresponding to given MR elements 50, and the reference numerals 62 denote upper electrodes corresponding to the MR elements 50. As shown in FIG. 11, each lower electrode 61 has a long slender shape. Two lower electrodes 61 adjoining in the longitudinal direction of the lower electrodes 61 have a gap therebetween. MR elements 50 are disposed near both longitudinal ends on the top surface of each lower electrode 61. Each upper electrode 62 has a long slender shape, and electrically connects two adjoining MR elements 50 that are disposed on two lower electrodes 61 adjoining in the longitudinal direction of the lower electrodes 61.

Although not shown in the drawings, an MR element 50 located at the end of a row of MR elements 50 is connected to another MR element 50 located at the end of another row of MR elements 50 adjoining in a direction intersecting with the longitudinal direction of the lower electrodes 61. The two MR elements 50 are connected to each other by a not-shown electrode. The not-shown electrode may be an electrode connecting the bottom surfaces of the two MR elements 50 or the upper surfaces of the same.

If the MR elements 50 shown in FIG. 11 are first MR elements 50A, the lower electrodes 61 shown in FIG. 11 correspond to lower electrodes 61A, and the upper electrodes 62 shown in FIG. 11 correspond to upper electrodes 62A. In such a case, the longitudinal direction of the lower electrodes 61 is parallel to the V direction.

Each of the plurality of upper coil elements 72 extends in a direction parallel to the Y direction. The plurality of upper coil elements 72 are arranged in the X direction. In particular, in the present example embodiment, when seen in the Z direction, each of the plurality of first MR elements 50A overlaps two upper coil elements 72.

Each of the plurality of lower coil elements 71 extends in a direction parallel to the Y direction. The plurality of lower coil elements 71 are arranged in the X direction. The shape and arrangement of the plurality of lower coil elements 71 may be the same as or different from those of the plurality of upper coil elements 72.

In the example shown in FIGS. 7 and 8, the plurality of lower coil elements 71 and the plurality of upper coil elements 72 are electrically connected to constitute the first coil 70 that applies a magnetic field in a direction parallel to the X direction to the free layers 54 of the respective first MR elements 50A. The first coil 70 may be configured so that a magnetic field in the X direction can be applied to the free layers 54 in the first and second resistor sections R11 and R12 and a magnetic field in the −X direction can be applied to the free layers 54 in the third and fourth resistor sections R13 and R14. The first coil 70 may be controlled by the processor 40.

Next, a structure of the second chip 3 will be described with reference to FIGS. 9 and 10. FIG. 10 shows a part of a cross section at the position indicated by the line 10-10 in FIG. 9.

The second chip 3 includes a substrate 301 having a top surface 301a, insulating layers 302, 303, 304, 305, 307, 308, 309, and 310, a plurality of lower electrodes 61B, a plurality of lower electrodes 61C, a plurality of upper electrodes 62B, a plurality of upper electrodes 62C, a plurality of lower coil elements 81, and a plurality of upper coil elements 82. The top surface 301a of the substrate 301 is parallel to the XY plane. The Z direction is a direction perpendicular to the top surface 301a of the substrate 301.

The insulating layer 302 is disposed on the substrate 301. The plurality of lower coil elements 81 are disposed on the insulating layer 302. The insulating layer 303 is disposed around the plurality of lower coil elements 81 on the insulating layer 302. The insulating layers 304 and 305 are stacked in this order on the plurality of lower coil elements 81 and the insulating layer 303.

The plurality of lower electrodes 61B and the plurality of lower electrodes 61C are disposed on the insulating layer 305. The insulating layer 307 is disposed around the plurality of lower electrodes 61B and around the plurality of lower electrodes 61C on the insulating layer 305. The plurality of second MR elements 50B are disposed on the plurality of lower electrodes 61B. The plurality of third MR elements 50C are disposed on the plurality of lower electrodes 61C. The insulating layer 308 is disposed around the plurality of second MR elements 50B and around the plurality of third MR elements 50C on the plurality of lower electrodes 61B, the plurality of lower electrodes 61C, and the insulating layer 307. The plurality of upper electrodes 62B are disposed on the plurality of second MR elements 50B and the insulating layer 308. The plurality of upper electrodes 62C are disposed on the plurality of third MR elements 50C and the insulating layer 308. The insulating layer 309 is disposed around the plurality of upper electrodes 62B and around the plurality of upper electrodes 62C on the insulating layer 308.

The insulating layer 310 is disposed on the plurality of upper electrodes 62B, the plurality of upper electrodes 62C, and the insulating layer 309. The plurality of upper coil elements 82 are disposed on the insulating layer 310. The second chip 3 may further include a not-shown insulating layer that covers the plurality of upper coil elements 82 and the insulating layer 310.

The second chip 3 includes a support member that supports the plurality of second MR elements 50B and the plurality of third MR elements 50C. The support member has at least one inclined surface inclined relative to the top surface 301a of the substrate 301. In particular, in the present example embodiment, the support member includes the insulating layer 305. FIG. 9 shows the insulating layer 305, the plurality of second MR elements 50B, the plurality of third MR elements 50C, and the plurality of upper coil elements 82 among the components of the second chip 3.

The insulating layer 305 includes a plurality of protruding surfaces 305c each protruding in a direction away from the top surface 301a of the substrate 301 (Z direction). The plurality of protruding surfaces 305c each extend in the direction parallel to the U direction. The overall shape of each protruding surface 305c is a triangular roof shape obtained by moving the triangular shape of the protruding surface 305c shown in FIG. 10 along the direction parallel to the U direction. The plurality of protruding surfaces 305c are arranged in the direction parallel to the V direction.

Now, focus is placed on any one of the plurality of protruding surfaces 305c. The protruding surface 305c includes a first inclined surface 305a and a second inclined surface 305b. The first inclined surface 305a is a surface forming a part of the protruding surface 305c on the side of the V direction. The second inclined surface 305b is a surface forming a part of the protruding surface 305c on the side of the −V direction.

The top surface 301a of the substrate 301 is parallel to the XY plane. The reference plane 4a is parallel to the XY plane. The first inclined surface 305a and the second inclined surface 305b are each inclined relative to each of the top surface 301a of the substrate 301 and the reference plane 4a. The second inclined surface 305b faces a direction different from the first inclined surface 305a. A gap between the first inclined surface 305a and the second inclined surface 305b in a VZ cross section perpendicular to the top surface 301a of the substrate 301 becomes smaller in the direction away from the top surface 301a of the substrate 301.

In the example embodiment, there are plurality of protruding surfaces 305c, and thus there are a plurality of first inclined surfaces 305a and a plurality of second inclined surfaces 305b. The insulating layer 305 includes the plurality of first inclined surfaces 305a and the plurality of second inclined surfaces 305b.

The plurality of lower electrodes 61B are disposed on the plurality of first inclined surfaces 305a. The plurality of lower electrodes 61C are disposed on the plurality of second inclined surfaces 305b. As describe above, the first and second inclined surfaces 305a and 305b are each inclined relative to the top surface 301a of the substrate 301, i.e., the XY plane. The top surface of each of the plurality of lower electrodes 61B and the top surface of each of the plurality of lower electrode 61C are thus also inclined relative to the XY plane. The reference plane 4a is parallel to the XY plane. Thus, it can be said that the plurality of second MR elements 50B and the plurality of third MR elements 50C are disposed on the inclined surfaces inclined relative to the reference plane 4a. The insulating layer 305 is a member for supporting each of the plurality of second MR elements 50B and the plurality of third MR elements 50C so as to allow each of the MR elements to be inclined relative to the reference plane 4a.

Each of the plurality of first inclined surfaces 305a may be a plane that is at least partially parallel to the U direction and the W1 direction. Each of the plurality of second inclined surfaces 305b may be a plane that is at least partially parallel to the U direction and the W2 direction.

The protruding surface 305c may be a semi-cylindrical curved surface formed by moving the curved shape (arch shape) along the direction parallel to the U direction. In such a case, the first inclined surface 305a is a curved surface. The second MR elements 50B are curved along the curved surface (the first inclined surface 305a). Even in such a case, the magnetization direction of the magnetization pinned layer 52 of each second MR element 50B is defined as a straight direction as described above for convenience sake. Similarly, the second inclined surface 305b is a curved surface. The third MR elements 50C are curved along the curved surface (the second inclined surface 305b). Even in such a case, the magnetization direction of the magnetization pinned layer 52 of each third MR element 50C is defined as a straight direction as described above for convenience sake.

Although not shown, the insulating layer 305 further includes a flat surface present around the plurality of protruding surfaces 305c. The plurality of protruding surfaces 305c may protrude from the flat surface in the Z direction. The plurality of protruding surfaces 305c may be disposed with predetermined gaps therebetween so that a flat surface is formed between two adjoining protruding surfaces 305c. Alternatively, the insulating layer 305 may have groove portions recessed from the flat surface in the −Z direction. In such a case, the plurality of protruding surfaces 305c may be present in the groove portions.

As shown in FIG. 9, the plurality of second MR elements 50B are disposed so that two or more MR elements 50B are arranged both in the U direction and in the V direction. A plurality of second MR elements 50B are arranged in a row on one first inclined surface 305a. Similarly, the plurality of third MR elements 50C are disposed so that two or more MR elements 50C are arranged both in the U direction and in the V direction. A plurality of third MR elements 50C are arranged in a row on one second inclined surface 305b. In the example embodiment, a plurality of rows of second MR elements 50B and a plurality of rows of third MR elements 50C are alternately arranged in the direction parallel to the V direction.

The plurality of second MR elements 50B are connected in series by the plurality of lower electrodes 61B and the plurality of upper electrodes 62B. The foregoing description of the method for connecting the plurality of first MR elements 50A also applies to a method for connecting the plurality of second MR elements 50B. If the MR elements 50 shown in FIG. 11 are second MR elements 50B, the lower electrodes 61 shown in FIG. 11 correspond to lower electrodes 61B, and the upper electrodes 62 shown in FIG. 11 correspond to upper electrodes 62B. In such a case, the longitudinal direction of the lower electrodes 61 is parallel to the U direction.

Similarly, the plurality of third MR elements 50C are connected in series by the plurality of lower electrodes 61C and the plurality of upper electrodes 62C. The foregoing description of the method for connecting the plurality of first MR elements 50A also applies to a method for connecting the plurality of third MR elements 50C. If the MR elements 50 shown in FIG. 11 are third MR elements 50C, the lower electrodes 61 shown in FIG. 11 correspond to lower electrodes 61C, and the upper electrodes 62 shown in FIG. 11 correspond to upper electrodes 62C. In such a case, the longitudinal direction of the lower electrodes 61 is parallel to the U direction.

Each of the plurality of upper coil elements 82 extends in a direction parallel to the Y direction. The plurality of upper coil elements 82 are arranged in the X direction. In particular, in the present example embodiment, when seen in the Z direction, each of the plurality of second MR elements 50B and the plurality of third MR elements 50C overlaps two upper coil elements 82.

Each of the plurality of lower coil elements 81 extends in a direction parallel to the Y direction. The plurality of lower coil elements 81 are arranged in the X direction. The shape and arrangement of the plurality of lower coil elements 81 may be the same as or different from those of the plurality of upper coil elements 82.

In the example shown in FIGS. 9 and 10, the plurality of lower coil elements 81 and the plurality of upper coil elements 82 are electrically connected to constitute the second coil 80 that applies a magnetic field in the direction parallel to the X direction to the free layer 54 in each of the plurality of second MR elements 50B and the plurality of third MR elements 50C. The second coil 80 may be configured, for example, so that a magnetic field in the X direction can be applied to the free layers 54 in the first and second resistor sections R21 and R22 of the second detection circuit 20 and the first and second resistor sections R31 and R32 of the third detection circuit 30, and a magnetic field in the −X direction can be applied to the free layers 54 in the third and fourth resistor sections R23 and R24 of the second detection circuit 20 and the third and fourth resistor sections R33 and R34 of the third detection circuit 30. The second coil 80 may be controlled by the processor 40.

Next, the first to third detection signals will be described. First, the first detection signal will be described with reference to FIG. 4. As the strength of the component of the target magnetic field in the direction parallel to the U direction changes, the resistance of each of the resistor sections R11 to R14 of the first detection circuit 10 changes either so that the resistances of the resistor sections R11 and R13 increase and the resistances of the resistor sections R12 and R14 decrease or so that the resistances of the resistor sections R11 and R13 decrease and the resistances of the resistor sections R12 and R14 increase. Thereby the electric potential of each of the signal output ports E11 and E12 changes. The first detection circuit 10 generates a signal corresponding to the electric potential of the signal output port E11 as a first detection signal S11, and generates a signal corresponding to the electric potential of the signal output port E12 as a first detection signal S12.

Next, the second detection signal will be described with reference to FIG. 5. As the strength of the component of the target magnetic field in the direction parallel to the W1 direction changes, the resistance of each of the resistor sections R21 to R24 of the second detection circuit 20 changes either so that the resistances of the resistor sections R21 and R23 increase and the resistances of the resistor sections R22 and R24 decrease or so that the resistances of the resistor sections R21 and R23 decrease and the resistances of the resistor sections R22 and R24 increase. Thereby the electric potential of each of the signal output ports E21 and E22 changes. The second detection circuit 20 generates a signal corresponding to the electric potential of the signal output port E21 as a second detection signal S21, and generates a signal corresponding to the electric potential of the signal output port E22 as a second detection signal S22.

Next, the third detection signal will be described with reference to FIG. 6. As the strength of the component of the target magnetic field in the direction parallel to the W2 direction changes, the resistance of each of the resistor sections R31 to R34 of the third detection circuit 30 changes either so that the resistances of the resistor sections R31 and R33 increase and the resistances of the resistor sections R32 and R34 decrease or so that the resistances of the resistor sections R31 and R33 decrease and the resistances of the resistor sections R32 and R34 increase. Thereby the electric potential of each of the signal output ports E31 and E32 changes. The third detection circuit 30 generates a signal corresponding to the electric potential of the signal output port E31 as a third detection signal S31, and generates a signal corresponding to the electric potential of the signal output port E32 as a third detection signal S32.

Next, an operation of the processor 40 will be described. The processor 40 is configured to generate the first detection value based on the first detection signals S11 and S12. The first detection value is a detection value corresponding to the component of the target magnetic field in the direction parallel to the U direction. The first detection value will hereinafter be represented by the symbol Su.

In the present example embodiment, the processor 40 generates the first detection value Su by an arithmetic including obtainment of a difference S11−S12 between the first detection signal S11 and the first detection signal S12. The first detection value Su may be the difference S11−S12 itself. The first detection value Su may be a result of predetermined corrections, such as gain adjustment and offset adjustment, made on the difference S11−S12.

The processor 40 is further configured to generate the second and third detection values based on the second detection signals S21 and S22 and the third detection signals S31 and S32. The second detection value is a detection value corresponding to the component of the target magnetic field in the direction parallel to the V direction. The third detection value is a detection value corresponding to the component of the target magnetic field in the direction parallel to the Z direction. Hereinafter, the second detection value is represented by a symbol Sv, and the third detection value is represented by a symbol Sz.

The processor 40 generates the second and third detection values Sv and Sz as follows, for example. First, the processor 40 generates a value S1 by an arithmetic including obtainment of the difference S21−S22 between the second detection signal S21 and the second detection signal S22, and generates a value S2 by an arithmetic including obtainment of the difference S31−S32 between the third detection signal S31 and the third detection signal S32. Next, the processor 40 calculates values S3 and S4 using the following expressions (1) and (2).

$$S3=(S2+S1)/(2 \cos \alpha) \quad (1)$$

$$S4=(S2-S1)/(2 \sin \alpha) \quad (2)$$

The second detection value Sv may be the value S3 itself, or may be a result of predetermined corrections, such as a gain adjustment and an offset adjustment, made to the value S3. In the same manner, the third detection value Sz may be the value S4 itself, or may be a result of predetermined corrections, such as a gain adjustment and an offset adjustment, made to the value S4.

Figure 12:
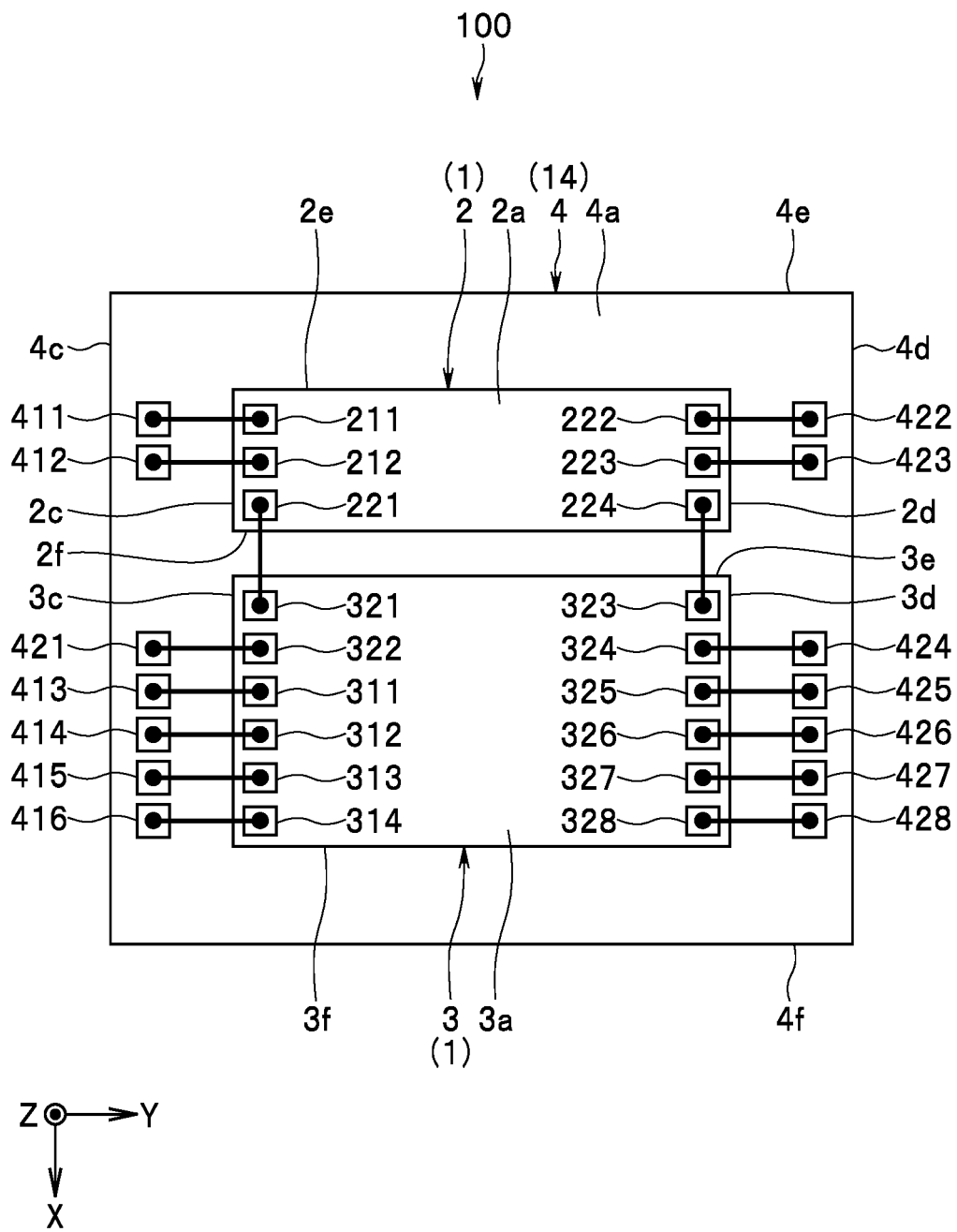
FIG. 12 is a plan view showing the magnetic sensor device according to the example embodiment of the technology.

Next, structural features of the magnetic sensor device 100 according to the present example embodiment will be described. FIG. 12 is a plan view showing the magnetic sensor device 100.

First, the plurality of terminals will be described. The first chip 2 includes two end portions 2c and 2d located at both ends in the direction parallel to the Y direction, and two end portions 2e and 2f located at both ends in the direction parallel to the X direction. The end portion 2c is located at an end of the first chip 2 in the −Y direction. The end portion 2d is located at an end of the first chip 2 in the Y direction. The end portion 2e is located at an end of the first chip 2 in the −X direction. The end portion 2f is located at an end of the first chip 2 in the X direction. In particular, in the present example embodiment, the four end portions 2c to 2f are also four side surfaces connecting the top surface 2a and the bottom surface 2b of the first chip 2.

The magnetic sensor 1 includes a plurality of sensor terminals provided on the first chip 2. The plurality of sensor terminals of the first chip 2 include a plurality of signal terminals 211 and 212 and a plurality of power supply terminals 221, 222, 223, and 224. The signal terminals 211 and 212 are both disposed on the side of the end portion 2c of the first chip 2. The power supply terminal 221 is disposed on the side of the end portion 2c of the first chip 2. In particular, in the present example embodiment, the signal terminals 211 and 212 and the power supply terminal 221 are arranged in this order in the X direction along the end portion 2c of the first chip 2.

The power supply terminals 222 to 224 are disposed on the side of the end portion 2d of the first chip 2. In particular, in the present example embodiment, the power supply terminals 222 to 224 are arranged in this order in the X direction along the end portion 2d of the first chip 2. In the first chip 2, the number of terminals disposed on the side of the end portion 2c of the first chip 2 and the number of terminals disposed on the side of the end portion 2d of the first chip 2 are equal.

The second chip 3 includes two end portions 3c and 3d located at both ends in the direction parallel to the Y direction, and two end portions 3e and 3f located at both ends in the direction parallel to the X direction. The end portion 3c is located at an end of the second chip 3 in the −Y direction. The end portion 3d is located at an end of the second chip 3 in the Y direction. The end portion 3e is located at an end of the second chip 3 in the −X direction. The end portion 3f is located at an end of the second chip 3 in the X direction. In particular, in the present example embodiment, the four end portions 3c to 3f are also four side surfaces connecting the top surface 3a and the bottom surface 3b of the second chip 3.

The magnetic sensor 1 further includes a plurality of sensor terminals provided on the second chip 3. The plurality of sensor terminals of the second chip 3 include a plurality of signal terminals 311, 312, 313, and 314 and a plurality of power supply terminals 321, 322, 323, 324, 325, 326, 327, and 328. The signal terminals 311 to 314 are all disposed on the side of the end portion 3c of the second chip 3. The power supply terminals 321 and 322 are disposed on the side of the end portion 3c of the second chip 3. In particular, in the present example embodiment, the power supply terminals 321 and 322 and the signal terminals 311 to 314 are arranged in this order in the X direction along the end portion 3c of the second chip 3.

The power supply terminals 323 to 328 are disposed on the side of the end portion 3d of the second chip 3. In particular, in the present example embodiment, the power supply terminals 323 to 328 are arranged in this order in the X direction along the end portion 3d of the second chip 3. In the second chip 3, the number of terminals disposed on the side of the end portion 3c of the second chip 3 and the number of terminals disposed on the side of the end portion 3d of the second chip 3 are equal.

The first chip 2 and the second chip 3 are arranged in this order along the X direction. In particular, in the present example embodiment, the first chip 2 and the second chip 3 are disposed such that the power supply terminal 221 of the first chip 2 and the power supply terminal 321 of the second chip 3 adjoin each other.

The signal terminals 211 and 212 and the power supply terminal 221 of the first chip 2, and the power supply terminals 321 and 322 and the signal terminals 311 to 314 of the second chip 3 are arranged in a row along the direction parallel to the Y direction. Note that at least some of such terminals may be disposed at the same position in the direction parallel to the Y direction, or may be disposed at different positions in the direction parallel to the Y direction.

The power supply terminals 222 to 224 of the first chip 2 and the power supply terminals 323 to 328 of the second chip 3 are arranged in a row along the direction parallel to the Y direction. Note that at least some of such terminals may be disposed at the same position in the direction parallel to the Y direction, or may be disposed at different positions in the direction parallel to the Y direction.

The number of terminals provided on the first chip 2 is 6. The number of terminals provided on the second chip 3 is 12, which is larger than the number of terminals provided on the first chip 2.

The circuit main body 4 includes two end portions 4c and 4d located at both ends in the direction parallel to the Y direction, and two end portions 4e and 4f located at both ends in the direction parallel to the X direction. The end portion 4c is located at an end of the circuit main body 4 in the −Y direction. The end portion 4d is located at an end of the circuit main body 4 in the Y direction. The end portion 4e is located at an end of the circuit main body 4 in the −X direction. The end portion 4f is located at an end of the circuit main body 4 in the X direction. In particular, in the present example embodiment, the four end portions 4c to 4f are also four side surfaces connecting the reference plane 4a and the bottom surface 4b of the circuit main body 4.

The signal processing circuit 14 includes a plurality of circuit terminals provided on the circuit main body 4. The plurality of circuit terminals include a plurality of signal terminals 411, 412, 413, 414, 415, and 416 and a plurality of power supply terminals 421, 422, 423, 424, 425, 426, 427, and 428. The signal terminals 411 to 416 are all disposed on the side of the end portion 4c of the circuit main body 4. The power supply terminal 421 is disposed on the side of the end portion 4c of the circuit main body 4. In particular, in the present example embodiment, the signal terminals 411 and 412, the power supply terminal 421, and the signal terminals 413 to 416 are arranged in this order in the X direction along the end portion 4c of the circuit main body 4.

The power supply terminals 422 to 428 are disposed on the side of the end portion 4d of the circuit main body 4. In particular, in the present example embodiment, the power supply terminals 422 to 428 are arranged in this order in the X direction along the end portion 4d of the circuit main body 4.

The first and second chips 2 and 3 are disposed between the terminals 411 to 416 and 421 and the terminals 422 to 428.

The signal processing circuit 14 may further include a plurality of not-shown terminals provided on the circuit main body 4 and connected to the printed board 5. The plurality of not-shown terminals may be disposed on the side of the end portion 4e or the side of the end portion 4f of the circuit main body 4, for example.

Next, connection relationships between the plurality of terminals will be described. Two given terminals of the plurality of terminals are connected by a bonding wire, for example. Note that the bonding wire is omitted in FIGS. 1 and 2.

The signal terminals 411 to 416 and the power supply terminal 421 of the circuit main body 4 are arranged in a row. The signal terminals 211 and 212 and the power supply terminal 221 of the first chip 2 and the signal terminals 311 to 314 and the power supply terminals 321 and 322 of the second chip 3 are arranged in a row along the signal terminals 411 to 416 and the power supply terminal 421 of the circuit main body 4.

The power supply terminals 422 to 428 of the circuit main body 4 are arranged in a row. The power supply terminals 222 to 224 of the first chip 2 and the power supply terminals 323 to 328 of the second chip 3 are arranged in a row along the power supply terminals 422 to 428 of the circuit main body 4.

The signal terminals 211 and 212 of the first chip 2 are respectively connected to the signal terminals 411 and 412 of the circuit main body 4. The power supply terminals 221 and 224 of the first chip 2 are respectively connected to the power supply terminals 321 and 323 of the second chip 3. The power supply terminals 222 and 223 of the first chip 2 are respectively connected to the power supply terminals 422 and 423 of the circuit main body 4.

The signal terminals 311, 312, 313, and 314 of the second chip 3 are respectively connected to the signal terminals 413, 414, 415, and 416 of the circuit main body 4. The power supply terminals 322, 324, 325, 326, 327, and 328 of the second chip 3 are respectively connected to the power supply terminals 421, 424, 425, 426, 427, and 428 of the circuit main body 4.

Next, relationships between the plurality of terminals and the circuit components shown in FIGS. 3 to 6 will be described. The signal terminals 211 and 212 and the power supply terminals 221 and 223 provided on the first chip 2 are electrically connected to the first detection circuit 10 shown in FIG. 4. The signal terminals 211 and 212 are respectively electrically connected to the signal output ports E11 and E12. The power supply terminal 221 is electrically connected to the ground port G1. The power supply terminal 223 is electrically connected to the power supply port V1. The power supply terminals 222 and 224 are connected to the first coil 70 shown in FIG. 3, and are used as terminals for the coil.

The signal terminals 311 to 314 and the power supply terminals 321, 322, 326, and 327 provided on the second chip 3 are electrically connected to the second detection circuit 20 shown in FIG. 5 and to the third detection circuit 30 shown in FIG. 6. The signal terminals 311, 312, 313, and 314 are respectively electrically connected to the signal output ports E21, E22, E31, and E32. The power supply terminals 321 and 322 are each electrically connected to both the ground ports G2 and G3. The power supply terminals 326 and 327 are respectively electrically connected to the power supply ports V2 and V3. The power supply terminals 323 to 325 and 328 are connected to the second coil 80 shown in FIG. 3, and are used as terminals for the coil.

The power supply terminals 221, 321, and 322 are electrically connected to the power supply terminal 421 of the circuit main body 4. The power supply terminals 221, 321, 322, and 421 are connected to the ground.

Figure 13:
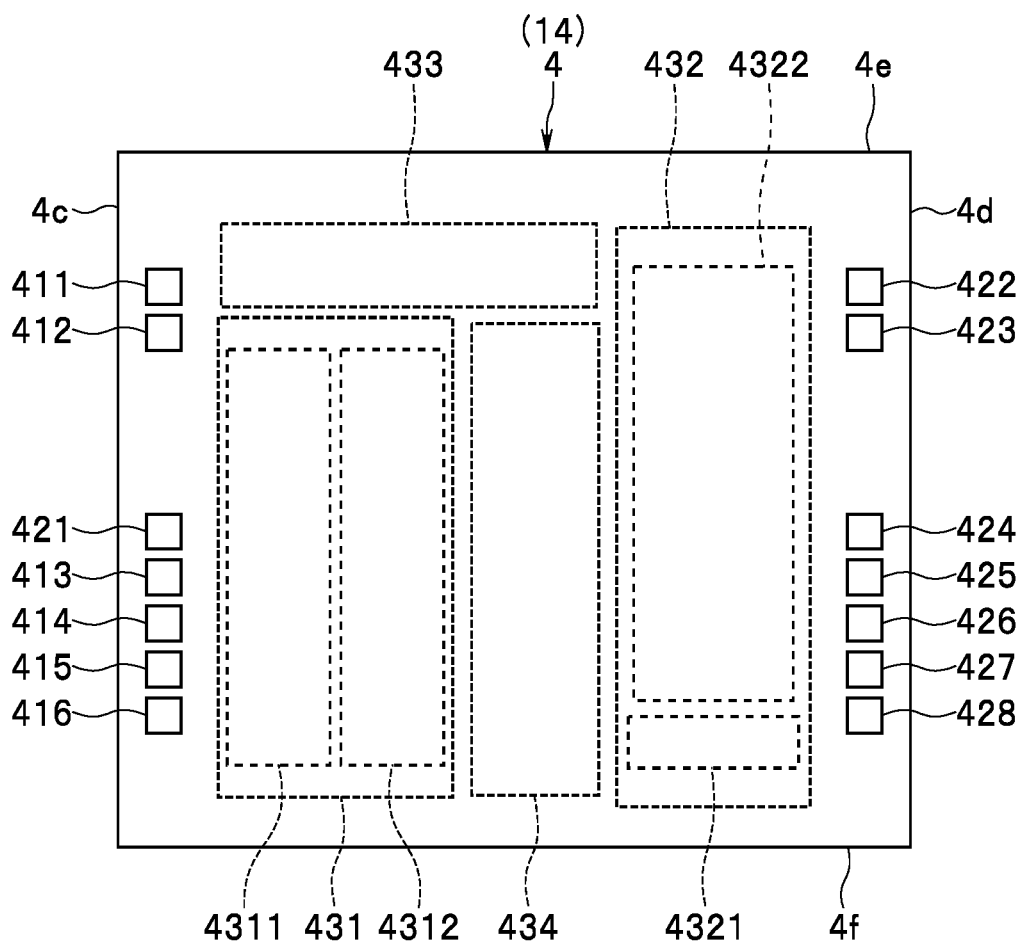
FIG. 13 is a plan view showing arrangement of a plurality of blocks in a signal processing circuit according to the example embodiment of the technology.

Next, an example of the configuration of the signal processing circuit 14 will be described with reference to FIG. 13. FIG. 13 is a plan view showing a plurality of blocks in the signal processing circuit 14.

The signal processing circuit 14 includes at least a first block 431 and a second block 432 provided in the circuit main body 4. The first block 431 is configured to process the first detection signals S11 and S12, the second detection signals S21 and S22, and the third detection signals S31 and S32 of the magnetic sensor 1.

The first block 431 is disposed at a position closer to the end portion 4c of the circuit main body 4 than a position where the second block 432 is disposed. Thus, the first block 431 is disposed at a position closer to the signal terminals 411 to 416 than a position where the second block 432 is disposed.

The first block 431 may include an analog front-end block 4311 and a digital signal processing block 4312 connected to the analog front-end block 4311, for example. The analog front-end block 4311 is connected to the signal output ports E11 and E12 of the first detection circuit 10 shown in FIG. 4, the signal output ports E21 and E22 of the second detection circuit 20 shown in FIG. 5, and the signal output ports E31 and E32 of the third detection circuit 30 shown in FIG. 6 via the signal terminals 211, 212, 311 to 314, and 411 to 416. The analog front-end block 4311 executes a predetermined process on the first detection signals S11 and S12, the second detection signals S21 and S22, and the third detection signals S31 and S32, and also executes a process of converting the first detection signals S11 and S12, the second detection signals S21 and S22, and the third detection signals S31 and S32 into digital signals.

The digital signal processing block 4312 executes a predetermined process on the first detection signals S11 and S12, the second detection signals S21 and S22, and the third detection signals S31 and S32, which have been converted into digital signals, to generate the first to third detection values Su, Sv, and Sz.

The second block 432 is configured to supply power to the magnetic sensor 1. The second block 432 is disposed at a position closer to the end portion 4d of the circuit main body 4 than a position where the first block 431 is disposed. Thus, the second block 432 is disposed at a position closer to the power supply terminals 422 to 428 than a position where the first block 431 is disposed.

The second block 432 may include a first power supply block 4321 and a second power supply block 4322, for example. The first power supply block 4321 is configured to supply power to each of the first to third detection circuits 10, 20, and 30. In other words, the first power supply block 4321 is connected to the power supply port V1 and the ground port G1 of the first detection circuit 10 shown in FIG. 4, the power supply port V2 and the ground port G2 of the second detection circuit 20 shown in FIG. 5, and the power supply port V3 and the ground port G3 of the third detection circuit 30 shown in FIG. 6 via the power supply terminals 221, 223, 321, 322, 326, 327, 421, 423, 426, and 427.

The second power supply block 4322 is configured to supply power to each of the first and second coils 70 and 80. In other words, the second power supply block 4322 is connected to the first coil 70 and the second coil 80 shown in FIG. 3 via the power supply terminals 222, 224, 323 to 325, 328, 422, 424, 425, and 428.

The signal processing circuit 14 further includes a plurality of not-shown wires provided on the circuit main body 4 and connecting the first power supply block 4321 and the power supply terminals 421, 423, 426, and 427. The plurality of wires include a first wire having a predetermined length and forming a part of a path from the first to third detection circuits 10, 20, and 30 to the first power supply block 4321.

The signal processing circuit 14 further includes a plurality of not-shown wires provided on the circuit main body 4 and connecting the second power supply block 4322 and the power supply terminals 422, 424, 425, and 428. The plurality of wires include a second wire having a predetermined length and forming a part of a path from the first and second coils 70 and 80 to the second power supply block 4322.

The width of the first wire is smaller than the width of the second wire. In other words, the width of the second wire is greater than the width of the first wire. The width of the second wire may be in the range of 1.2 times to 500 times the width of the first wire, for example.

The signal processing circuit 14 further includes an interface block 433 and an auxiliary circuit block 434. The interface block 433 is configured to be able to output the first to third detection values Su, Sv, and Sz as digital signals to the outside of the signal processing circuit 14.

The interface block 433 may be disposed between the first block 431 and the end portion 4e of the circuit main body 4, for example. The auxiliary circuit block 434 may be disposed between the first block 431 and the second block 432, for example.

Next, operations and effects of the magnetic sensor 1, the signal processing circuit 14, and the magnetic sensor device 100 according to the present example embodiment will be described. In the present example embodiment, the signal terminals 211 and 212 of the magnetic sensor 1 provided on the first chip 2 are both disposed on the side of the end portion 2c of the first chip 2. The power supply terminals 221 to 224 of the magnetic sensor 1 provided on the first chip 2 include at least one first terminal disposed on the side of the end portion 2c of the first chip 2, and a plurality of second terminals disposed on the side of the end portion 2d of the first chip 2. In particular, in the present example embodiment, the at least one first terminal corresponds to the power supply terminal 221, and the plurality of second terminals correspond to the power supply terminals 222 to 224. According to the present example embodiment, the dimension of the first chip 2 in the direction parallel to the X direction can be reduced in comparison with a case where the power supply terminals 221 to 224 are all disposed on the side of the end portion 2d of the first chip 2.

In the present example embodiment, the signal terminals 311 to 314 of the magnetic sensor 1 provided on the second chip 3 are all disposed on the side of the end portion 3c of the second chip 3. The power supply terminals 321 to 328 of the magnetic sensor 1 provided on the second chip 3 include at least one first terminal disposed on the side of the end portion 3c of the second chip 3, and a plurality of second terminals disposed on the side of the end portion 3d of the second chip 3. In particular, in the present example embodiment, the at least one first terminal corresponds to the power supply terminals 321 and 322, and the plurality of second terminals correspond to the power supply terminals 323 to 328. According to the present example embodiment, the dimension of the second chip 3 in the direction parallel to the X direction can be reduced in comparison with a case where the power supply terminals 321 to 328 are all disposed on the side of the end portion 3d of the second chip 3.

In the present example embodiment, the signal terminals 411 to 416 of the signal processing circuit 14 provided on the circuit main body 4 are all disposed on the side of the end portion 4c of the circuit main body 4. The power supply terminals 421 to 428 of the signal processing circuit 14 provided on the circuit main body 4 include at least one first terminal disposed on the side of the end portion 4c of the circuit main body 4, and a plurality of second terminals disposed on the side of the end portion 4d of the circuit main body 4. In particular, in the present example embodiment, the at least one first terminal corresponds to the power supply terminal 421, and the plurality of second terminals correspond to the power supply terminals 422 to 428. According to the present example embodiment, the signal processing circuit 14 can be used as a signal processing circuit for the first and second chips 2 and 3 with the foregoing features.

By the way, in the signal processing circuit 14, the width of each of a plurality of power supply wires connected to the first to third detection circuits 10, 20, and 30 can be made smaller than the width of each of a plurality of power supply wires connected to the first and second coils 70 and 80. Parasitic capacitance of a wire becomes smaller as the width of the wire is smaller. It is preferable to dispose power supply terminals for the first to third detection circuits 10, 20, and 30 on the side of the end portion 4c of the circuit main body 4 from the perspective of suppressing noise generated due to mutual interference with a plurality of signal wires connected to the first to third detection circuits 10, 20, and 30.

As described above, in the present example embodiment, the power supply terminal 421 is disposed on the side of the end portion 4c of the circuit main body 4. The power supply terminal 221 electrically connected to the ground port G1 shown in FIG. 5, and the power supply terminals 321 and 322 each electrically connected to both the ground port G2 shown in FIG. 6 and the ground port G3 shown in FIG. 7 are connected to the power supply terminal 421. In other words, the power supply terminal 421 is used as a terminal for the first to third detection circuits 10, 20, and 30. Thereby according to the present example embodiment, noise can be suppressed.

Modification Example

Figure 14:
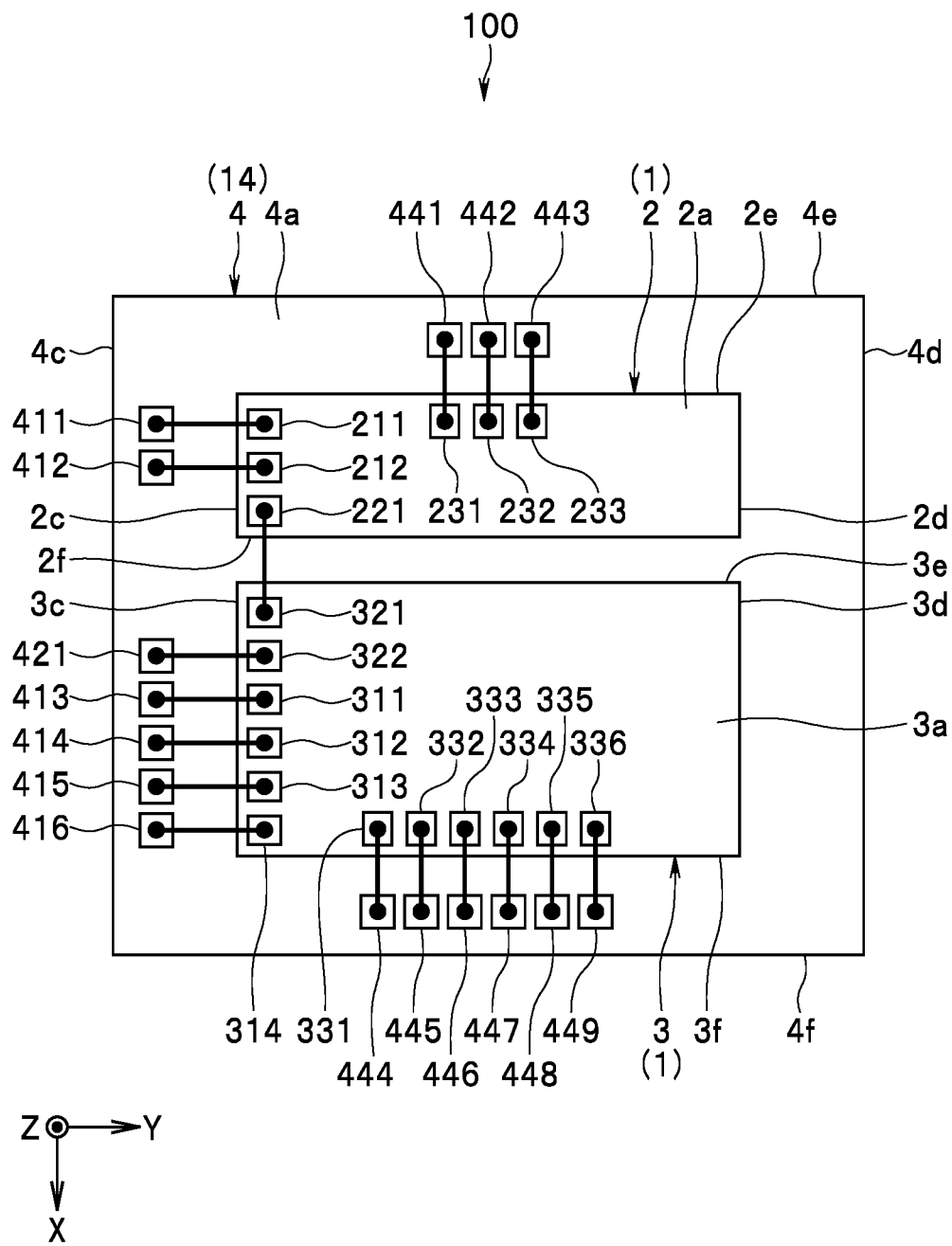
FIG. 14 is a plan view showing a modification example of the magnetic sensor device according to the example embodiment of the technology.

Next, a modification example of the magnetic sensor device 100 according to the present example embodiment will be described with reference to FIG. 14. FIG. 14 is a plan view showing the modification example of the magnetic sensor device 100.

In the modification example, the magnetic sensor 1 includes power supply terminals 231, 232, and 233 provided on the first chip 2 instead of the power supply terminals 222 to 224. The power supply terminals 231 to 233 are disposed on the side of the end portion 2e of the first chip 2. In particular, in the present example embodiment, the power supply terminals 231 to 233 are arranged in this order in the Y direction along the end portion 2e of the first chip 2.

In the modification example, the magnetic sensor 1 also includes power supply terminals 331, 332, 333, 334, 335, and 336 provided on the second chip 3 instead of the power supply terminals 323 to 328. The power supply terminals 331 to 336 are disposed on the side of the end portion 3f of the second chip 3. In particular, in the present example embodiment, the power supply terminals 331 to 336 are arranged in this order in the Y direction along the end portion 3f of the second chip 3.

In the modification example, the signal processing circuit 14 includes power supply terminals 441, 442, 443, 444, 445, 446, 447, 448, and 449 provided on the circuit main body 4 instead of the power supply terminals 422 to 428. The power supply terminals 441 to 443 are disposed on the side of the end portion 4e of the circuit main body 4. In particular, in the present example embodiment, the power supply terminals 441 to 443 are arranged in this order in the Y direction along the end portion 4e of the circuit main body 4.

The power supply terminals 444 to 449 are disposed on the side of the end portion 4f of the circuit main body 4. In particular, in the present example embodiment, the power supply terminals 444 to 449 are arranged in this order in the Y direction along the end portion 4f of the circuit main body 4.

The power supply terminals 231 to 233 of the first chip 2 are respectively connected to the power supply terminals 441 to 443 of the circuit main body 4. The power supply terminals 331 to 336 of the second chip 3 are respectively connected to the power supply terminals 444 to 449 of the circuit main body 4.

Relationships between the power supply terminals 231 to 233 and the circuit components shown in FIGS. 3 to 6 are similar to the relationships between the power supply terminals 222 to 224 and the circuit components shown in FIGS. 3 to 6. Relationships between the power supply terminals 331 to 336 and the circuit components shown in FIGS. 3 to 6 are similar to the relationships between the power supply terminals 323 to 328 and the circuit components shown in FIGS. 3 to 6.

The technology is not limited to the foregoing example embodiment, and various modifications may be made thereto. For example, the magnetic sensor of the technology may include a plurality of chips that are integrated.

Connection between the plurality of terminals of each of the first and second chips 2 and 3 and the plurality of terminals of the circuit main body 4 may be made not only by bonding wires but also by plated wires or bumps. The first chip 2 and the second chip 3 may also be mounted on the circuit main body 4 by the flip chip method.

As described above, the magnetic sensor according to one embodiment of the technology includes at least one sensor main body; a detection circuit provided on the at least one sensor main body, the detection circuit including a magnetic detection element; and a plurality of sensor terminals provided on the at least one sensor main body. The plurality of sensor terminals include a plurality of signal terminals and a plurality of power supply terminals. The plurality of signal terminals are all disposed on a side of one end of the at least one sensor main body. The plurality of power supply terminals include at least one first terminal disposed on the side of the one end of the at least one sensor main body, and a plurality of second terminals disposed on a side of another end of the at least one sensor main body.

In the magnetic sensor according to one embodiment of the technology, the at least one first terminal may be connected to a ground. The at least one first terminal may be electrically connected to the detection circuit.

In the magnetic sensor according to one embodiment of the technology, a sum of the number of the plurality of signal terminals and the number of the at least one first terminal may be equal to the number of the plurality of second terminals.

The magnetic sensor according to one embodiment of the technology may further include a coil provided on the at least one sensor main body, the coil being configured to generate a magnetic field to be applied to the magnetic detection element. The plurality of second terminals may include a plurality of terminals for the coil.

In the magnetic sensor according to one embodiment of the technology, the at least one sensor main body may include a first sensor main body and a second sensor main body. The first sensor main body and the second sensor main body may be disposed such that the at least one first terminal of the first sensor main body and the at least one first terminal of the second sensor main body adjoin each other. The plurality of signal terminals and the at least one first terminal of the first sensor main body and the plurality of signal terminals and the at least one first terminal of the second sensor main body may be arranged in a row. The plurality of second terminals of the first sensor main body and the plurality of second terminals of the second sensor main body may be arranged in a row. The detection circuit of the first sensor main body may be configured to detect a component of a target magnetic field in a first direction. The detection circuit of the second sensor main body may be configured to detect a component of the target magnetic field in a second direction and a component of the target magnetic field in a third direction.

The signal processing circuit according to one embodiment of the technology is a signal processing circuit for a magnetic sensor. The signal processing circuit may include a circuit main body; a first block provided on the circuit main body, the first block being configured to process a detection signal of the magnetic sensor; a second block provided on the circuit main body, the second block being configured to supply power to the magnetic sensor; and a plurality of circuit terminals provided on the circuit main body. The plurality of circuit terminals include a plurality of signal terminals and a plurality of power supply terminals. The plurality of signal terminals are all disposed on a side of one end of the circuit main body. The plurality of power supply terminals include at least one first terminal disposed on the side of the one end of the circuit main body, and a plurality of second terminals disposed on a side of another end of the circuit main body.

In the signal processing circuit according to one embodiment of the technology, the at least one first terminal may be connected to a ground.

In the signal processing circuit according to one embodiment of the technology, the plurality of signal terminals and the at least one first terminal may be a plurality of terminals arranged in a row. The plurality of signal terminals may include a terminal located at one end of the row of the plurality of terminals, and a terminal located at another end of the row of the plurality of terminals.

The magnetic sensor device according to one embodiment of the technology includes a magnetic sensor and a signal processing circuit for the magnetic sensor. The magnetic sensor includes at least one sensor main body, a detection circuit provided on the at least one sensor main body, the detection circuit including a magnetic detection element, and a plurality of sensor terminals provided on the at least one sensor main body. The plurality of sensor terminals include a plurality of first signal terminals and a plurality of first power supply terminals. The plurality of first signal terminals are all disposed on a side of one end of the at least one sensor main body. The plurality of first power supply terminals include at least one first terminal disposed on the side of the one end of the at least one sensor main body, and a plurality of second terminals disposed on a side of another end of the at least one sensor main body.

The signal processing circuit includes a circuit main body, a first block provided on the circuit main body, the first block being configured to process a detection signal of the magnetic sensor, a second block provided on the circuit main body, the second block being configured to supply power to the magnetic sensor, and a plurality of circuit terminals provided on the circuit main body. The plurality of circuit terminals include a plurality of second signal terminals respectively electrically connected to the plurality of first signal terminals, and a plurality of second power supply terminals respectively electrically connected to the plurality of first power supply terminals. The plurality of second signal terminals are all disposed on a side of one end of the circuit main body. The plurality of second power supply terminals include at least one third terminal disposed on the side of the one end of the circuit main body, and a plurality of fourth terminals disposed on a side of another end of the circuit main body.

In the magnetic sensor device according to one embodiment of the technology, each of the at least one first terminal and the at least one third terminal may be connected to a ground.

In the magnetic sensor device according to one embodiment of the technology, the magnetic sensor may further include a coil provided on the at least one sensor main body, the coil being configured to generate a magnetic field to be applied to the magnetic detection element. The plurality of second terminals may include a plurality of terminals for the coil. The signal processing circuit may include a first wire having a predetermined length and forming a part of a path from the detection circuit to the second block, and a second wire having a predetermined length and forming a part of a path from the coil to the second block. A width of the first wire may be smaller than a width of the second wire.

In the magnetic sensor device according to one embodiment of the technology, the plurality of second signal terminals and the at least one third terminal may be arranged in a row. The plurality of first signal terminals and the at least one first terminal may be arranged in a row along the plurality of second signal terminals and the at least one third terminal. The plurality of fourth terminals may be arranged in a row. The plurality of second terminals may be arranged in a row along the plurality of fourth terminals.

In the magnetic sensor device according to one embodiment of the technology, the at least one sensor main body may include a first sensor main body and a second sensor main body. The at least one first terminal of the first sensor main body may include one first terminal. The at least one first terminal of the second sensor main body may include two first terminals. The at least one third terminal of the circuit main body may include one third terminal. One of the two first terminals and the one third terminal may be electrically connected. The detection circuit of the first sensor main body may be configured to detect a component of a target magnetic field in a first direction. The detection circuit of the second sensor main body may be configured to detect a component of the target magnetic field in a second direction and a component of the target magnetic field in a third direction.

Obviously, various modification examples and variations of the technology are possible in the light of the above teachings. Thus, it is to be understood that, within the scope of the appended claims and equivalents thereof, the technology may be practiced in other embodiments than the foregoing example embodiment.

What is claimed is:

1. A magnetic sensor device comprising a magnetic sensor and a signal processing circuit for the magnetic sensor, wherein:
the magnetic sensor includes
at least one sensor main body,
a detection circuit provided on the at least one sensor main body, the detection circuit including a magnetic detection element, and
a plurality of sensor terminals provided on the at least one sensor main body;
the plurality of sensor terminals include a plurality of first signal terminals and a plurality of first power supply terminals;
the plurality of first signal terminals are all disposed on a side of one end of the at least one sensor main body;
the plurality of first power supply terminals include at least one first terminal disposed on the side of the one end of the at least one sensor main body, and a plurality of second terminals disposed on a side of another end of the at least one sensor main body;

the signal processing circuit includes
a circuit main body,
a first block provided on the circuit main body, the first block being configured to process a detection signal of the magnetic sensor,
a second block provided on the circuit main body, the second block being configured to supply power to the magnetic sensor, and
a plurality of circuit terminals provided on the circuit main body;

the plurality of circuit terminals include a plurality of second signal terminals respectively electrically connected to the plurality of first signal terminals, and a plurality of second power supply terminals respectively electrically connected to the plurality of first power supply terminals;

the plurality of second signal terminals are all disposed on a side of one end of the circuit main body; and the plurality of second power supply terminals include at least one third terminal disposed on the side of the one end of the circuit main body, and a plurality of fourth terminals disposed on a side of another end of the circuit main body.

2. The magnetic sensor device according to claim 1, wherein each of the at least one first terminal and the at least one third terminal is connected to a ground.

3. The magnetic sensor device according to claim 1, wherein:
the magnetic sensor further includes a coil provided on the at least one sensor main body, the coil being configured to generate a magnetic field to be applied to the magnetic detection element; and
the plurality of second terminals include a plurality of terminals for the coil.

4. The magnetic sensor device according to claim 1, wherein:
the magnetic sensor further includes a coil provided on the at least one sensor main body, the coil being configured to generate a magnetic field to be applied to the magnetic detection element;
the plurality of second terminals include a plurality of terminals for the coil;
the signal processing circuit includes a first wire having a predetermined length and forming a part of a path from the detection circuit to the second block, and a second wire having a predetermined length and forming a part of a path from the coil to the second block; and
a width of the first wire is smaller than a width of the second wire.

5. The magnetic sensor device according to claim 1, wherein:
the plurality of second signal terminals and the at least one third terminal are arranged in a row;
the plurality of first signal terminals and the at least one first terminal are arranged in a row along the plurality of second signal terminals and the at least one third terminal;
the plurality of fourth terminals are arranged in a row; and
the plurality of second terminals are arranged in a row along the plurality of fourth terminals.

6. The magnetic sensor device according to claim 1, wherein:
the at least one sensor main body includes a first sensor main body and a second sensor main body;
the at least one first terminal of the first sensor main body includes one first terminal;
the at least one first terminal of the second sensor main body includes two first terminals; and
the at least one third terminal of the circuit main body includes one third terminal.

7. The magnetic sensor device according to claim 1, wherein:
the at least one sensor main body includes a first sensor main body and a second sensor main body;
the at least one first terminal of the second sensor main body includes two first terminals;
the at least one third terminal of the circuit main body includes one third terminal; and
one of the two first terminals and the one third terminal are electrically connected.

8. The magnetic sensor device according to claim 1, wherein:
the at least one sensor main body includes a first sensor main body and a second sensor main body;
the detection circuit of the first sensor main body is configured to detect a component of a target magnetic field in a first direction; and
the detection circuit of the second sensor main body is configured to detect a component of the target magnetic field in a second direction and a component of the target magnetic field in a third direction.

* * * * *